US008343857B2

(12) United States Patent
Toriumi

(10) Patent No.: US 8,343,857 B2
(45) Date of Patent: Jan. 1, 2013

(54) MANUFACTURING METHOD OF MICROCRYSTALLINE SEMICONDUCTOR FILM AND MANUFACTURING METHOD OF SEMICONDUCTOR DEVICE

(75) Inventor: Satoshi Toriumi, Ebina (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 24 days.

(21) Appl. No.: 13/093,174

(22) Filed: Apr. 25, 2011

(65) Prior Publication Data

US 2011/0263080 A1 Oct. 27, 2011

(30) Foreign Application Priority Data

Apr. 27, 2010 (JP) ................................. 2010-102205

(51) Int. Cl.
*H01L 21/00* (2006.01)
(52) U.S. Cl. ........ 438/485; 438/151; 438/488; 438/513; 257/E21.09; 257/E21.411
(58) Field of Classification Search .................. None
See application file for complete search history.

(56) References Cited

U.S. PATENT DOCUMENTS

| | | | |
|---|---|---|---|
| 4,409,134 A | 10/1983 | Yamazaki |
| 5,453,858 A | 9/1995 | Yamazaki |
| 5,591,987 A | 1/1997 | Yamazaki et al. |
| 5,648,293 A | 7/1997 | Hayama et al. |
| 5,648,662 A | 7/1997 | Zhang et al. |
| 5,701,167 A | 12/1997 | Yamazaki |
| 5,731,626 A | 3/1998 | Eaglesham et al. |
| 5,766,989 A | 6/1998 | Maegawa et al. |
| 5,811,328 A | 9/1998 | Zhang et al. |
| 5,849,601 A | 12/1998 | Yamazaki |
| 6,023,075 A | 2/2000 | Yamazaki |
| 6,121,161 A | 9/2000 | Rossman et al. |
| 6,124,155 A | 9/2000 | Zhang et al. |
| 6,166,399 A | 12/2000 | Zhang et al. |
| 6,252,249 B1 | 6/2001 | Yamazaki |
| 6,271,062 B1 | 8/2001 | Nakata et al. |
| 6,306,213 B1 | 10/2001 | Yamazaki |
| 6,335,213 B1 | 1/2002 | Zhang et al. |

(Continued)

FOREIGN PATENT DOCUMENTS

EP 1 953 831 A2 6/2008

(Continued)

OTHER PUBLICATIONS

Arai, et al., "41.2: Micro Silicon Technology for Active Matrix OLED Display", SID Digest, SID International Symposium Digest of Technical, 2007, vol. 38, pp. 1370-1373.

(Continued)

*Primary Examiner* — Julio J Maldonado
*Assistant Examiner* — Yasser Abdelaziez
(74) *Attorney, Agent, or Firm* — Nixon Peabody LLP; Jeffrey L. Costellia

(57) ABSTRACT

To provide a manufacturing method of a microcrystalline semiconductor film, the manufacturing method comprises the steps of forming a first semiconductor film over a substrate by generating plasma by performing continuous discharge under an atmosphere containing a deposition gas; forming a second semiconductor film over the first semiconductor film by generating plasma by performing pulsed discharge under the atmosphere containing the deposition gas; forming a third semiconductor film over the second semiconductor film by generating plasma by performing continuous discharge under the atmosphere containing the deposition gas; and forming a fourth semiconductor film over the third semiconductor film by generating plasma by performing pulsed discharge under the atmosphere containing the deposition gas.

11 Claims, 14 Drawing Sheets

U.S. PATENT DOCUMENTS

| | | |
|---|---|---|
| 6,680,486 B1 | 1/2004 | Yamazaki |
| 6,756,258 B2 | 6/2004 | Zhang et al. |
| 6,797,548 B2 | 9/2004 | Zhang et al. |
| 6,847,064 B2 | 1/2005 | Zhang et al. |
| 7,067,844 B2 | 6/2006 | Yamazaki |
| 7,098,479 B1 | 8/2006 | Yamazaki |
| 7,115,902 B1 | 10/2006 | Yamazaki |
| 2002/0029818 A1 | 3/2002 | Murayama et al. |
| 2003/0109095 A1 | 6/2003 | Boydston et al. |
| 2004/0063254 A1 | 4/2004 | Wang et al. |
| 2005/0011435 A1 | 1/2005 | Dauelsberg |
| 2005/0017243 A1 | 1/2005 | Zhang et al. |
| 2005/0160984 A1 | 7/2005 | Schmitt |
| 2006/0024866 A1 | 2/2006 | Gan et al. |
| 2007/0018165 A1 | 1/2007 | Yamazaki |
| 2008/0044962 A1 | 2/2008 | Zhang et al. |
| 2008/0173348 A1 | 7/2008 | Nasuno et al. |
| 2008/0188033 A1 | 8/2008 | Choi et al. |
| 2009/0047759 A1 | 2/2009 | Yamazaki et al. |
| 2009/0137103 A1 | 5/2009 | Yamazaki |
| 2009/0321849 A1 | 12/2009 | Miyamura et al. |
| 2010/0323501 A1 | 12/2010 | Yamazaki et al. |
| 2011/0053357 A1 | 3/2011 | Yamazaki |
| 2011/0053358 A1 | 3/2011 | Toriumi et al. |

FOREIGN PATENT DOCUMENTS

| | | |
|---|---|---|
| EP | 1 953 831 A2 | 8/2008 |
| JP | 60-098680 | 6/1985 |
| JP | 61-087371 | 5/1986 |
| JP | 04-242724 | 8/1992 |
| JP | 05-217908 | 8/1993 |
| JP | 05-218003 | 8/1993 |
| JP | 06-077483 | 3/1994 |
| JP | 11-121761 | 4/1999 |
| JP | 2002-246605 | 8/2002 |
| JP | 2005-049832 | 2/2005 |
| JP | 2005-167051 | 6/2005 |
| JP | 2007-005508 | 1/2007 |
| JP | 2007-035964 | 2/2007 |
| JP | 2008-181960 | 8/2008 |

OTHER PUBLICATIONS

Lee, et al., "How to Achieve High Mobility Thin Film Transistors by Direct Deposition of Silicon Using 13.56 MHz RF PECVD?", IEDM 06: Technical Digest of International Electron Devices Meeting, Dec. 11, 2006, pp. 295-298.

Lee, et al., "Directly deposited nanocrystalline silicon thin-film transistors with ultra high mobilities", Applied Physics Letter, Dec. 18, 2006, vol. 89, No. 25, pp. 252101-1-1252101-3.

Lee, et al., "High-mobility nanocrystalline silicon thin-film transistors fabricated by plasma-enhanced chemical vapor deposition", Applied Physics Letters, May 24, 2005, vol. 86, pp. 222106-1-222106-3.

Lee, et al., "High Mobility N-Channel and P-Channel Nanocrystalline Silicon Thin-Film Transistors", IEDM 05: Technical Digest of International Electron Devices Meeting, 2005, pp. 937-940.

Esmaeili-Rad, et al., "High Stability, Low Leakage Nanocrystalline Silicon Bottom Gate Thin Film Transistors for AMOLED Displays", IEDM 06: Technical Digest of International Electron Devices Meeting, 2006, pp. 303-306.

Lee, et al., "Leakage current mechanisms in top-gate nanocrystalline silicon thin film transistors", Applied Physics Letters, Feb. 28, 2008, vol. 92, pp. 083509-1-083509-3.

Esmaeili-Rad, et al., "Absence of defect state creation in nanocrystalline silicon thin film transistors deduced from constant current stress measurements", Applied Physics Letters, Sep. 12, 2007, vol. 91, No. 11, pp. 113511-1-113511-3.

Lee, et al., "Stability of nc-Si:H TFTs With Silicon Nitride Gate Dielectric", IEEE Transactions on Electron Devices, 2007, vol. 54, No. 1, pp. 45-51.

Sazonov, et al., "Low-Temperature Materials and Thin Film Transistors for Flexible Electronics", Proceedings of the IEEE, Aug. 1, 2005, vol. 93, No. 8, pp. 1420-1428.

Esmaeili-Rad, et al., "Stability of nanocrystalline silicon bottom-gate thin film transistors with silicon nitride gate dielectric", Journal of Applied Physics, Sep. 28, 2007, vol. 102, No. 6, pp. 064512-1-064512-7.

Lee, et al., "Top-Gate TFTs Using 13.56 MHz PECVD Microcrystalline Silicon", IEEE Electron Device Letters, Sep. 5, 2005, vol. 26, No. 9, pp. 637-639.

Lee, et al., "Postdeposition thermal annealing and material stability of 75°C hydrogenated nanocrystalline silicon plasma-enhanced chemical vapor deposition films", Journal of Applied Physics, Aug. 4, 2005, vol. 98, No. 3, pp. 034305-1-034305-7.

MANUFACTURING METHOD OF MICROCRYSTALLINE SEMICONDUCTOR FILM AND MANUFACTURING METHOD OF SEMICONDUCTOR DEVICE

BACKGROUND OF THE INVENTION

1. Field of the Invention

The present invention relates to a manufacturing method of a microcrystalline semiconductor film and a manufacturing method of a semiconductor device. Note that, in this specification, a semiconductor device refers to a semiconductor element itself or a device including a semiconductor element. As such a semiconductor element, a transistor (e.g., a thin film transistor) is given, for example. A display device such as a liquid crystal display device is also included in the category of a semiconductor device.

2. Description of the Related Art

A microcrystalline semiconductor film has been actively developed as a semiconductor film which can be applied to a thin film transistor. A microcrystalline semiconductor film can be formed by a plasma CVD method, for example. When a microcrystalline semiconductor film is formed by a plasma CVD method, a film property can be controlled by conditions of plasma discharge, for example. Here, a film property refers to crystallinity of a film, uniformity of distribution of a substance included in a film, planarity of a film surface, and the like.

A microcrystalline semiconductor film can be applied to not only a thin film transistor but also a photoelectric conversion device. As a manufacturing method of a photoelectric conversion device having a high photoelectric conversion efficiency, in which microcrystalline silicon is used for a microcrystalline semiconductor film, the one disclosed in Patent Document 1 is given, for example.

Patent Document 1 discloses a manufacturing method of a stacked photoelectric conversion device in which first to third photoelectric conversion layers each having a p-i-n junction and being formed of a silicon-based semiconductor are stacked in this order from the light incident side; the first photoelectric conversion layer and the second photoelectric conversion layer have i-type amorphous layers formed of an amorphous silicon-based semiconductor and the third photoelectric conversion layer has an i-type microcrystalline layer formed of a microcrystalline silicon-based semiconductor; and the i-type amorphous layer of the first photoelectric conversion layer is formed by continuous discharge plasma and the i-type amorphous layer of the second photoelectric conversion layer is formed by pulsed discharge plasma.

REFERENCE

Patent Document

[Patent Document 1] Japanese Published Patent Application No. 2008-181960

SUMMARY OF THE INVENTION

In a microcrystalline semiconductor film having high crystallinity formed by only continuous discharge, epitaxial growth occurs when crystals are allowed to grow without changing the condition. In general, the dilution ratio of a deposition gas is made extremely high (i.e., the ratio of a flow rate of the deposition gas to a flow rate of a dilution gas is set to extremely small in a film formation gas) in deposition of a microcrystalline semiconductor film. When the dilution ratio of a deposition gas is not sufficiently high, a film easily becomes amorphous. Therefore, adjustment of the dilution ratio of the film formation gas is important for deposition of a microcrystalline semiconductor film.

However, when a microcrystalline semiconductor film is deposited using a film formation gas having a high dilution ratio, there is a problem in that the deposition gas enough for crystal growth is not supplied and thus crystals in the microcrystalline semiconductor film are sparse (spaces (cavities) are formed between a plurality of crystals). This phenomenon is seen remarkably as the thickness of the microcrystalline semiconductor film is increased.

On the other hand, when a microcrystalline semiconductor film is formed by pulsed discharge, it is difficult to supply energy enough for generation of crystal nuclei. In deposition of the microcrystalline semiconductor film by only pulsed discharge, as a period of time while pulsed discharge is not performed is longer, the crystallinity of the formed microcrystalline semiconductor film is reduced.

Note that, in this specification, pulsed discharge refers to discharge which is performed by voltage application between an upper electrode and a lower electrode for a short time. Here, "short time" means approximately longer than or equal to $1.0 \times 10^{-4}$ seconds and shorter than or equal to 1.0 second. In the case where power supply frequency is 13.56 MHz and the frequency of a sine wave AC waveform is 1 kHz, when the duty ratio is higher than or equal to 20% and lower than or equal to 30%, for example, a period of time while pulsed discharge is performed may be longer than or equal to $2.0 \times 10^{-4}$ seconds and shorter than or equal to 1.0 second. When the duty ratio is 10%, a period of time while pulsed discharge is performed may be longer than or equal to $1.0 \times 10^{-4}$ seconds and shorter than or equal to 1.0 second.

Note that, in this specification, the duty ratio refers to a ratio obtained by dividing a period of time while voltage is applied to the upper electrode (a period of time while power is supplied to the upper electrode) by a pulse period. That is, a duty ratio of 100% corresponds to continuous discharge.

An object of one embodiment of the present invention is to provide a manufacturing method of a microcrystalline semiconductor film, in which a plurality of crystal nuclei capable of forming a high-quality microcrystalline semiconductor film is generated, and the plurality of crystal nuclei is grown.

Another object of one embodiment of the present invention is to provide a manufacturing method of a thick and high-quality microcrystalline semiconductor film.

One embodiment of the present invention is a manufacturing method of a microcrystalline semiconductor film, in which continuous discharge and pulsed discharge are alternately performed. The microcrystalline semiconductor film can be applied to a semiconductor device.

One embodiment of the present invention is a manufacturing method of a microcrystalline semiconductor film, including a first step of generating plasma by performing continuous discharge under an atmosphere containing a deposition gas so that a plurality of crystal nuclei is generated, and a second step of generating plasma by performing pulsed discharge under the atmosphere containing the deposition gas so that spaces between the plurality of crystal nuclei are filled, in which the second step is performed after the first step.

One embodiment of the present invention is a manufacturing method of a microcrystalline semiconductor film, including a first step of generating plasma by performing continuous discharge under an atmosphere containing a deposition gas so that a plurality of crystal nuclei is generated, and a second step of generating plasma by performing pulsed discharge under the atmosphere containing the deposition gas so that spaces between the plurality of crystal nuclei are filled, in which the second step is performed after the first step, the first step is further performed after the second step, and then the second step is further performed.

One embodiment of the present invention is a manufacturing method of a microcrystalline semiconductor film, including a first step of generating plasma by performing continuous discharge under an atmosphere containing a deposition gas so that a plurality of crystal nuclei is generated, and a second step of generating plasma by performing pulsed discharge under the atmosphere containing the deposition gas so that spaces between the plurality of crystal nuclei are filled, in which the second step is performed after the first step, and after the second step is performed, the first step and the second step are repeated in this order plural times.

Note that the final step may be the first step. In other words, the first step and the second step are each performed at least once, the first step and the second step are performed alternately in this order, and either the first step or the second step may be the last step.

One embodiment of the present invention is a manufacturing method of a semiconductor device, including the steps of forming a gate electrode layer, forming a gate insulating layer to cover the gate electrode layer, forming a microcrystalline semiconductor film over the gate insulating layer by the manufacturing method of the microcrystalline semiconductor film according to any one of the above-described embodiments, and forming a source and a drain over the microcrystalline semiconductor film.

Note that in this specification, a "film" refers to a film which is formed over the entire surface of an object by a CVD method (including a plasma CVD method and the like), a sputtering method, or the like. On the other hand, a "layer" refers to a layer which is formed by processing a "film" or a layer which is formed over the entire surface of an object and does not require to be subjected to processing. However, a "film" and a "layer" are used without particular distinction in some cases.

Note that in this specification, "film formation" refers to a step for forming a film.

Further, in this specification, the term "source" refers to either or both of a source electrode and a source region, and the term "drain" refers to either or both of a drain electrode and a drain region. The source region refers to a portion which is formed using an impurity semiconductor film and in contact with a source electrode. The drain region refers to a portion which is formed using an impurity semiconductor film and in contact with a drain electrode.

By applying one embodiment of the present invention, a plurality of crystal nuclei capable of forming a high-quality microcrystalline semiconductor film is generated, so that a high-quality microcrystalline semiconductor film can be formed.

According to one embodiment of the present invention, a thick and high-quality microcrystalline semiconductor film can be formed.

BRIEF DESCRIPTION OF THE DRAWINGS

In the accompanying drawings.

DETAILED DESCRIPTION OF THE INVENTION

Figure 1A:
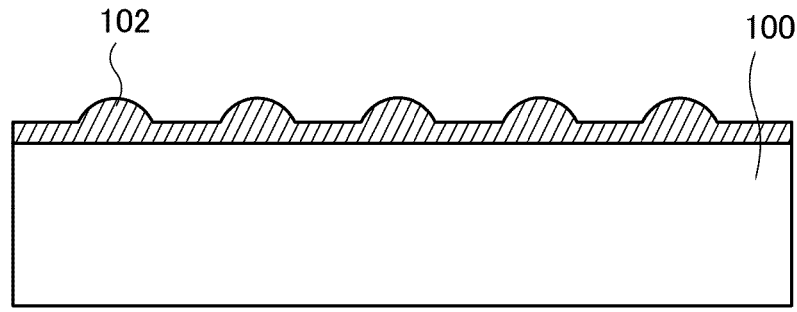
FIGS. 1A to 1D are conceptual views illustrating a manufacturing method of a microcrystalline semiconductor film.

Hereinafter, embodiments of the present invention will be described in detail with reference to the accompanying drawings. However, the present invention is not limited to the following description and it is easily understood by those skilled in the art that the modes and details can be variously changed without departing from the scope and spirit of the present invention. Accordingly, the present invention should not be construed as being limited to the description of the embodiments below. In describing structures of the present invention with reference to the drawings, the same reference numerals are used in common for the same portions in different drawings. The same hatching pattern is applied to similar parts, and the similar parts are not especially denoted by reference numerals in some cases. In addition, an insulating layer is not illustrated in a top view for convenience in some cases. Note that the size, the layer thickness, or the region of each structure illustrated in each drawing is exaggerated for clarity in some cases. Therefore, the present invention is not necessarily limited to such scales illustrated in the drawings.

Embodiment 1

In this embodiment, a manufacturing method of a semiconductor film which is one embodiment of the present invention will be described with reference to FIGS. 1A to 1D, FIGS. 2A and 2B, FIG. 3, FIGS. 4A and 4B, FIGS. 5A to 5C, FIG. 6, and FIG. 7.

FIGS. 1A to 1D are conceptual views illustrating an example of a manufacturing method of a semiconductor film formed by a plasma CVD method, which is described in this embodiment.

First, a plurality of crystal nuclei is generated over a substrate 100, and the plurality of crystal nuclei is grown to form a first semiconductor film 102. Here, plasma for forming the first semiconductor film 102 is generated by continuous discharge. Since the first semiconductor film 102 is formed by substantially isotropic growth of the crystal nuclei, the first semiconductor film 102 has unevenness at the surface and a large number of spaces between crystals (FIG. 1A).

Figure 2A:
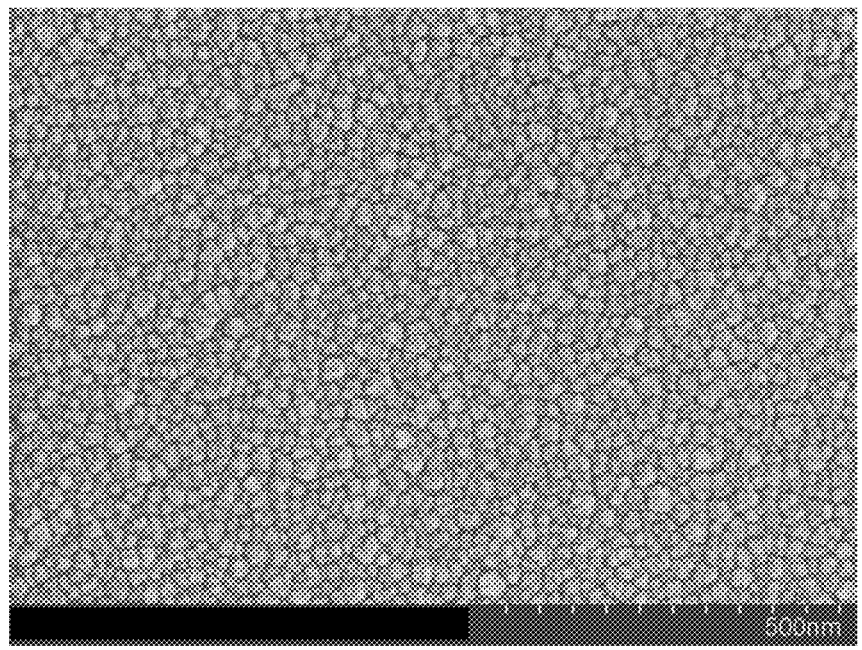
FIGS. 2A and 2B are SEM images of a semiconductor film formed by only continuous discharge.
Figure 2B:
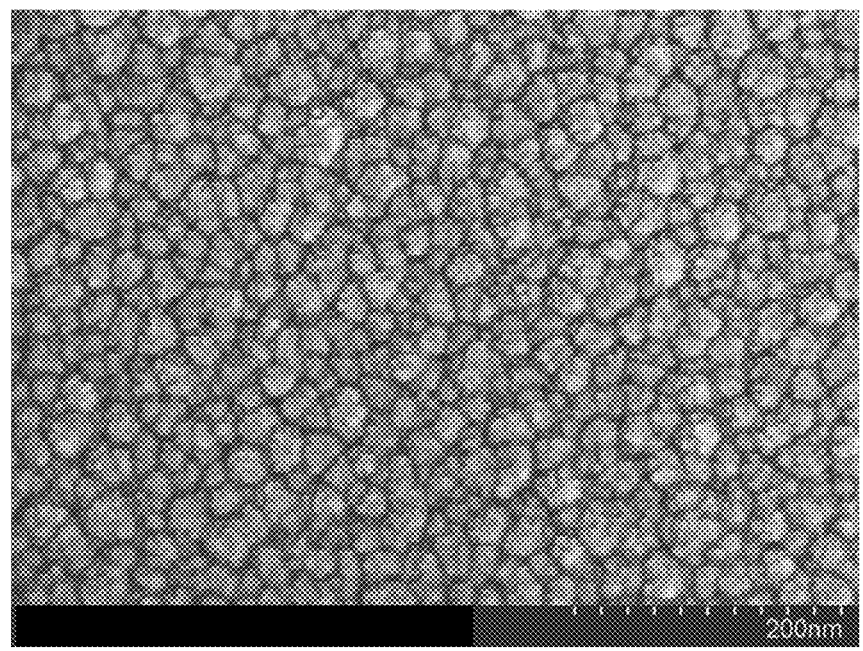

FIGS. 2A and 2B are examples of a scanning electron microscope (SEM) image of a semiconductor film formed by only continuous discharge. FIG. 2A is a SEM image enlarged at a magnification of a hundred thousand times and FIG. 2B is a SEM image enlarged at a magnification of two hundred thousand times. When crystal nuclei are generated and grown by only continuous discharge, a highly uneven surface is formed, as shown.

Figure 1B:
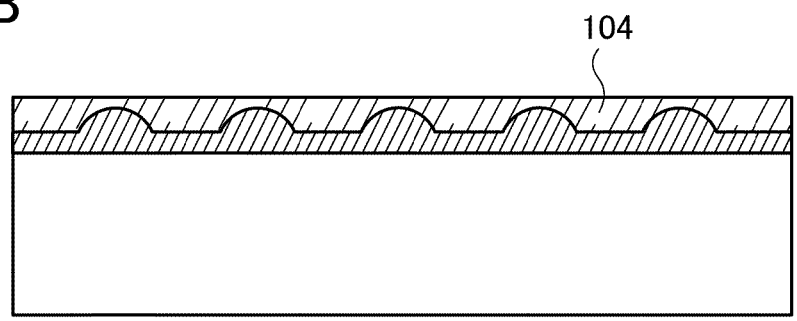
Figure 1C:
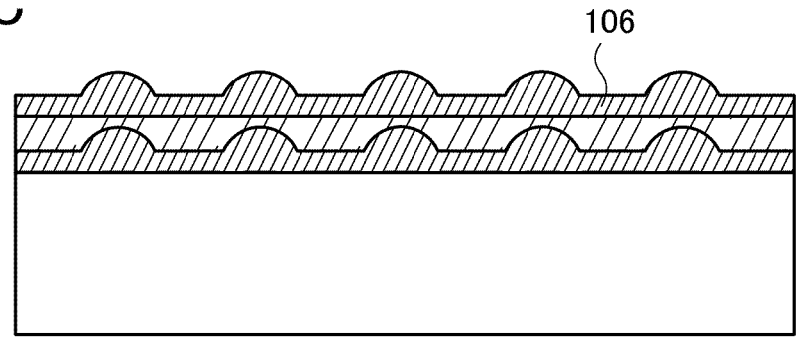

Next, a second semiconductor film 104 is formed over the first semiconductor film 102 so as to fill depressed portions of the first semiconductor film 102. Here, plasma for forming the second semiconductor film 104 is generated by pulsed discharge (FIG. 1B).

In formation of the semiconductor film in this embodiment, the first semiconductor film 102 is formed by continuous discharge and the second semiconductor film 104 is formed by pulsed discharge.

Here, the field effect mobility ($\mu FE=0.35$) of a thin film transistor in which only the first semiconductor film 102 is formed over the substrate 100 as a crystalline semiconductor film; the Id-Vg curve ($\mu FE=0.32$) of a thin film transistor in which only the second semiconductor film 104 is formed over the substrate 100 as a crystalline semiconductor film; and the Id-Vg curve ($\mu FE=0.39$) of a thin film transistor in which the first semiconductor film 102 and the second semiconductor film 104 are stacked over the substrate 100 in the above-described manner as a crystalline semiconductor film are shown. When these thin film transistors are compared, the field effect mobility of the thin film transistor in which the first semiconductor film 102 and the second semiconductor film 104 are stacked over the substrate 100 as a crystalline semiconductor film is the highest. The thin film transistors used here will be described in Embodiment 2.

Figure 1D:
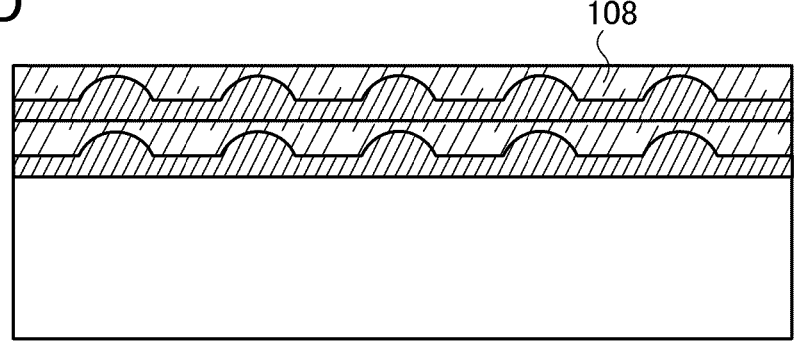

In formation of the semiconductor film in this embodiment, although the first step and the second step may be each performed once, it is preferable that the first step and the second step be repeated once or plural times. A further preferred mode of a film formation method of a semiconductor film in this embodiment is as follows: the first semiconductor film 102 is formed by continuous discharge, the second semiconductor film 104 is formed by pulsed discharge, a third semiconductor film 106 is formed by continuous discharge (FIG. 1C), and a fourth semiconductor film 108 is formed by pulsed discharge (FIG. 1D).

Figure 3:
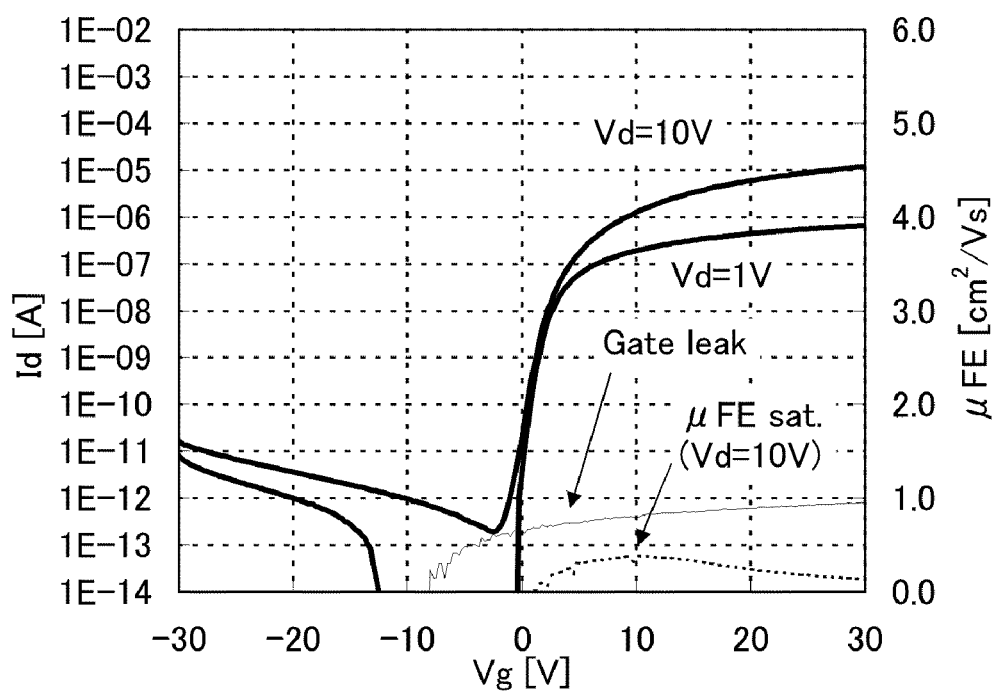
FIG. 3 is a graph showing an Id-Vg curve of a thin film transistor including a semiconductor film formed by performing a first step and a second step and further performing the first step and the second step.

FIG. 3 shows the Id-Vg curve of a thin film transistor manufactured as follows: the first step and the second step are performed and then the first step and the second step are further performed (a state of a conceptual view illustrated in FIG. 1D in which layers up to and including the fourth semiconductor film 108 are formed). This thin film transistor used here will be described in Embodiment 2.

Note that the Id-Vg curve refers to a curve obtained by measuring a drain current Id with respect to a gate voltage Vg when a drain voltage is constant. The gate voltage refers to a difference between a potential of a source and a potential of a gate. The drain current refers to a current that flows between a source and a drain. The drain voltage refers to a difference between a potential of a source and a potential of a drain.

The first semiconductor film 102 and the third semiconductor film 106 which are formed by only continuous discharge are semiconductor films having high crystallinity. On the other hand, although the second semiconductor film 104 and the fourth semiconductor film 108 which are formed by only pulsed discharge include crystals, the crystallinity thereof is low as compared with that of the first semiconductor film 102 or the third semiconductor film 106.

In a microcrystalline semiconductor film having high crystallinity formed by only continuous discharge, like the first semiconductor film 102 and the third semiconductor film 106, epitaxial growth occurs when crystals are allowed to grow without changing the condition. In general, the dilution ratio of a deposition gas is made extremely high (i.e., the ratio of a flow rate of the deposition gas to a flow rate of a dilution gas is set to extremely small in a film formation gas) in deposition of a microcrystalline semiconductor film. When the dilution ratio of a deposition gas is not sufficiently high, a film easily becomes amorphous. Therefore, adjustment of the dilution ratio of the film formation gas is important for deposition of a microcrystalline semiconductor film.

However, when a microcrystalline semiconductor film is deposited using a film formation gas having a high dilution ratio, there is a problem in that the deposition gas enough for crystal growth is not supplied and thus crystals in the microcrystalline semiconductor film are sparse (spaces (cavities) are formed between a plurality of crystals). This phenomenon is seen remarkably as the thickness of the microcrystalline semiconductor film is increased.

Figure 4A:
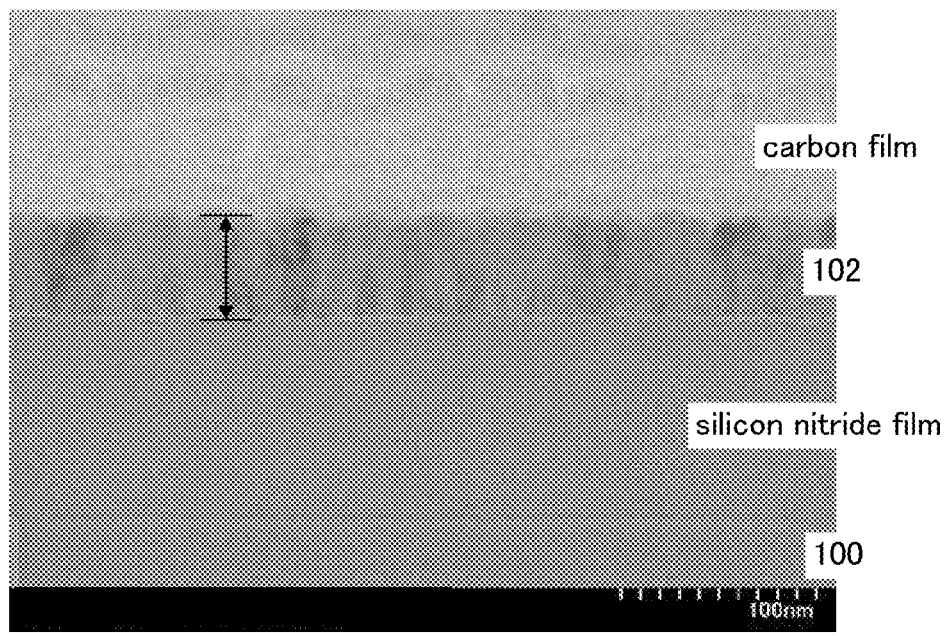
FIGS. 4A and 4B are STEM images of a semiconductor film formed by only continuous discharge and a semiconductor film formed by only pulsed discharge, respectively.

FIG. 4A shows a scanning transmission electron microscope (STEM) image (a bright-field image) of a structure in which a silicon nitride film is formed over the substrate 100 as a base film and the first semiconductor film 102 is formed over the silicon nitride film. Note that a carbon film is formed over the first semiconductor film 102 in order to observe the STEM image (in order to perform FIB processing). The thickness of a portion indicated by a two-headed arrow is 54.2 nm. As seen from FIG. 4A, in the first semiconductor film 102, the state of crystals on the silicon nitride film side is dense and the state of crystals becomes sparse as the crystals are far from the silicon nitride film.

On the other hand, when a microcrystalline semiconductor film is formed by pulsed discharge, it is difficult to supply energy enough for generation of crystal nuclei. In deposition of the microcrystalline semiconductor film by only pulsed discharge, as a period of time while pulsed discharge is not performed is longer, the crystallinity of the formed microcrystalline semiconductor film is reduced.

Figure 4B:
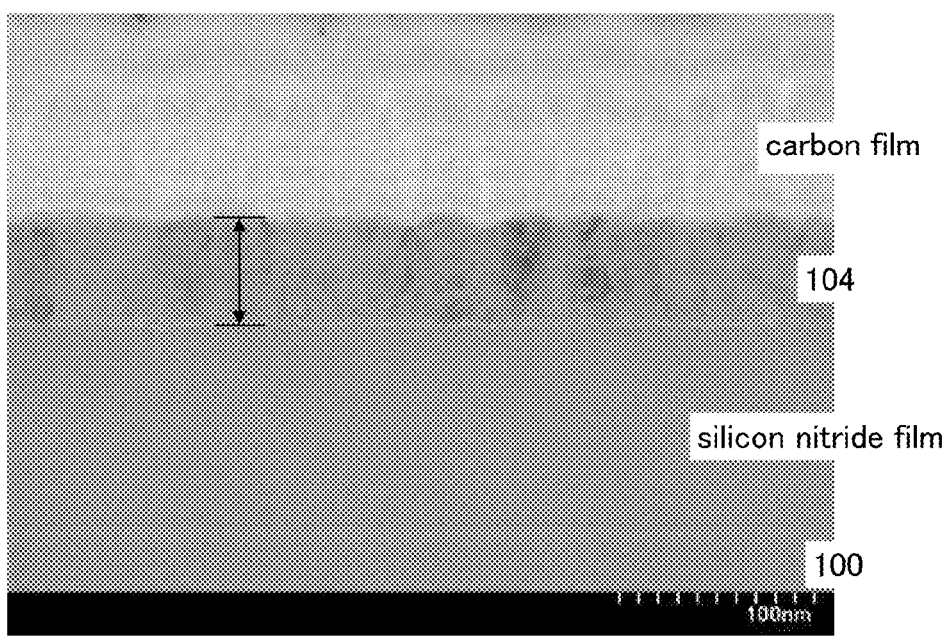

FIG. 4B shows a scanning transmission electron microscope (STEM) image (a bright-field image) of a structure in which a silicon nitride film is formed over the substrate 100 as a base film and the second semiconductor film 104 is formed over the silicon nitride film. Note that a carbon film is formed over the second semiconductor film 104 in order to observe the STEM image (in order to perform FIB processing). The thickness of a portion indicated by a two-headed arrow is 55.6 nm.

When film formation is performed by continuous discharge and then by pulsed discharge, a semiconductor film that is stacked over a microcrystalline semiconductor film is formed without influence of crystallinity of the microcrystalline semiconductor film formed by continuous discharge, whereby a crystalline semiconductor film which includes the microcrystalline semiconductor film and the semiconductor film can be formed. Therefore, when a semiconductor film which is formed without influence of crystallinity of the microcrystalline semiconductor film, like the second semiconductor film 104, is stacked over the microcrystalline semiconductor film, a semiconductor film whose crystals of the whole semiconductor film can be prevented from being sparse can be formed.

The semiconductor film of this embodiment can be used as a semiconductor film including a channel formation region of a thin film transistor included in a semiconductor device. In the semiconductor film of this embodiment, the second semiconductor film 104 whose crystallinity is lower than that of the first semiconductor film 102 and the third semiconductor film 106 is provided between the high-crystallinity first semiconductor film 102 and third semiconductor film 106. In the case where the semiconductor film is used for a channel formation region of a thin film transistor, current flows in the in-plane direction of the semiconductor film (i.e., a direction parallel to the surface of the substrate 100), and thus a decrease in carrier mobility and on-state current can be suppressed to the minimum even when a semiconductor film whose crystallinity is relatively low is formed between the semiconductor films. In this embodiment, an increase in carrier mobility and on-state current by filling spaces between crystals with the semiconductor film having a low crystallinity is advantageous even if the carrier mobility and on-state current are decreased owing to the semiconductor film having a low crystallinity formed between the semiconductor films. Therefore, with use of the semiconductor film of this embodiment, a thin film transistor having a high field effect mobility and high on-state current can be obtained.

Figure 5A:
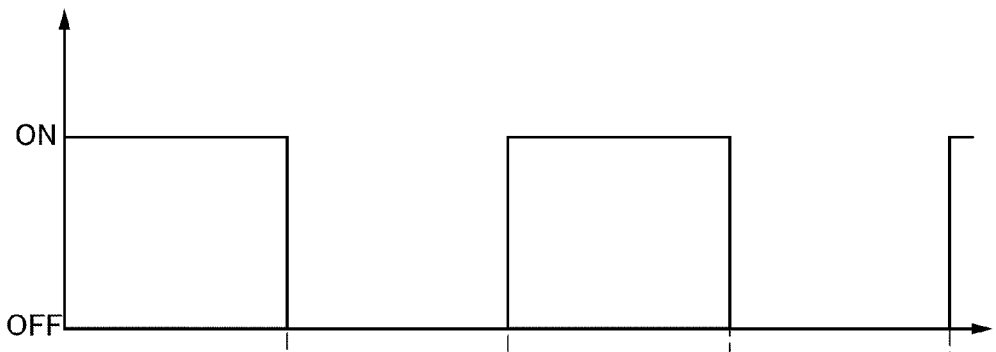
FIGS. 5A to 5C are charts showing timing of discharge with a plasma CVD apparatus used for forming a microcrystalline semiconductor film.
Figure 5B:
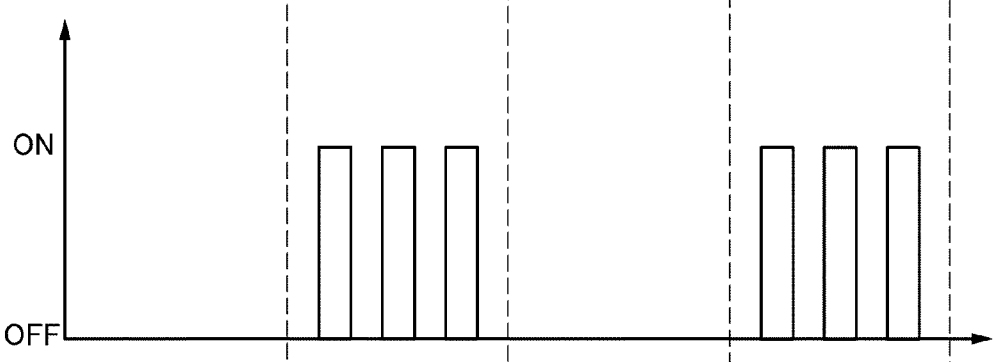
Figure 5C:
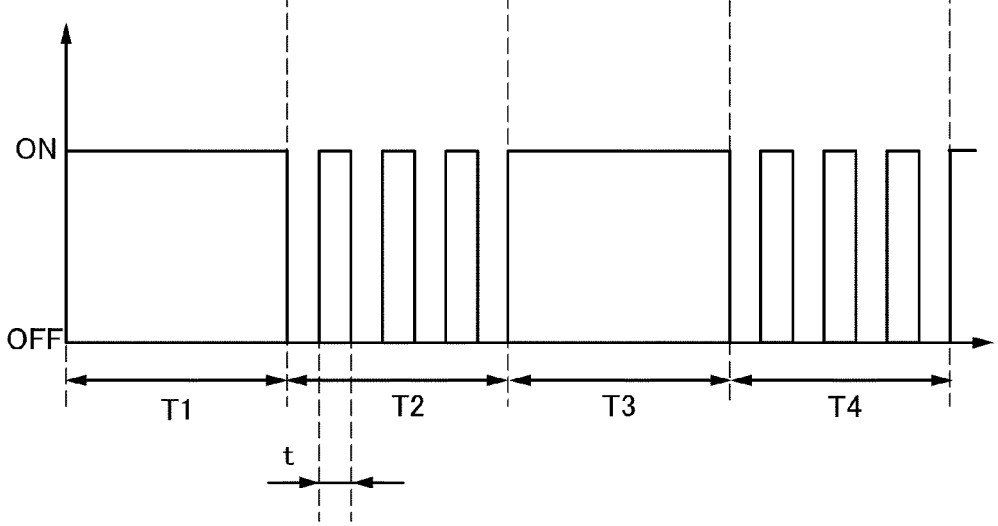

FIGS. 5A to 5C are charts showing timing of discharge for forming the semiconductor film described in this embodiment. The horizontal axis indicates time and the vertical axis indicates on/off of discharge. FIG. 5A shows continuous discharge. FIG. 5B shows pulsed discharge. FIG. 5C shows discharge in which continuous discharge and pulsed discharge are combined.

When the semiconductor film of this embodiment is formed, crystal nuclei are generated in an on state shown in FIG. 5A; and then discharge is stopped; and substantially at the same time as the stop of discharge, the semiconductor film is formed by pulsed discharge shown in FIG. 5B so as to fill spaces between the crystal nuclei.

Note that when the semiconductor film is formed by only continuous discharge shown in FIG. 5A, a plurality of crystal nuclei is coarsely grown and a part of the grown crystals are in contact with each other. In this case, it is difficult to fill spaces between such crystals and increase the carrier mobility of the formed microcrystalline semiconductor film.

When the semiconductor film is formed by only pulsed discharge shown in FIG. 5B, the deposition rate is low and it is difficult to generate crystal nuclei having a sufficient size; thus, a large number of amorphous components is contained in the formed film and the crystallinity thereof is low. Therefore, it is difficult to make the carrier mobility of the formed semiconductor film sufficiently high.

Accordingly, a microcrystalline semiconductor film having high crystallinity can be formed by a combination of continuous discharge and pulsed discharge shown in FIG. 5C.

Note that, as a reaction gas, a gas obtained by diluting monosilane with one or both of an $H_2$ gas and an argon (hereinafter referred to as Ar) gas by 150 to 750 times may be used. The deposition conditions may be as follows: the pressure in a chamber is 40 Pa to 2000 Pa; the power supply frequency is 13.56 MHz to 100 MHz; power from a power supply is 15 W to 1000 W (the power density is about 35 mW/cm$^2$ to 243 mW/cm$^2$); the distance between a surface of the upper electrode and the substrate over which a film is formed is 7 mm to 25 mm; and the substrate temperature is 50° C. to 400° C.

The preferable deposition conditions are as follows: the pressure in a chamber is 350 Pa to 1300 Pa; the power supply frequency is 13.56 MHz to 27.12 MHz; power from a power supply is 20 W to 200 W; the distance between the surface of the upper electrode and the substrate over which a film is formed is 7 mm to 15 mm; and the substrate temperature is 200° C. to 300° C. Under such deposition conditions, the throughput can be increased.

In a period T1, continuous discharge is preferably performed so that the thickness of a semiconductor film to be formed is about 10 nm. For example, in the case where a gas obtained by diluting monosilane with one or both of an $H_2$ gas and an Ar gas by about 300 times is used as a reaction gas; the pressure in a chamber is about 350 Pa; the power supply frequency is 13.56 MHz; power from a power supply is about 60 W (the power density is about 146 mW/cm$^2$); the distance between the surface of the upper electrode and the substrate over which a film is formed is about 25 mm; and the substrate temperature is about 250° C., the period T1 during which continuous discharge is performed is preferably about 2 minutes to 3 minutes.

When pulsed discharge is performed, the same conditions as the continuous discharge may be used and only the discharge method is set as appropriate. In pulsed discharge, discharge is performed by voltage application between electrodes for a "short time" (power supply to the upper electrode). The time of voltage application may be about longer than or equal to $1.0 \times 10^{-4}$ seconds and shorter than or equal to 1.0 second. For example, in the case where the power supply frequency is 13.56 MHz and the frequency of a sine wave AC waveform is 1 kHz, when the duty ratio is higher than or equal to 20% and lower than or equal to 30%, the time of voltage application may be about longer than or equal to $2.0 \times 10^{-4}$ seconds and shorter than or equal to 1.0 second. When the duty ratio is 10%, the time of voltage application may be about longer than or equal to $1.0 \times 10^{-4}$ seconds and shorter than or equal to 1.0 second. Note that the duty ratio refers to a ratio obtained by dividing a period of time while voltage is applied to the upper electrode (a period of time while power is supplied to the upper electrode) by a pulse period. That is, a period during which pulsed discharge is performed (a period t in FIGS. 5A to 5C) may be about $1.0 \times 10^{-3}$ seconds, for example. A duty ratio of 100% corresponds to continuous discharge (the period T1 in FIGS. 5A to 5C).

Note that, in the manufacturing method of the microcrystalline semiconductor film which is one embodiment of the present invention, deposition may be completed at the end of a period T2 or may be performed at the end of a period T4. Further, continuous discharge and pulsed discharge may be repeated once or plural times after the period T4.

In the case where the formed semiconductor film functions as a channel formation region of a thin film transistor, the semiconductor film is preferably formed to be thin (have a thickness greater than or equal to 11 nm and less than or equal to 50 nm, preferably greater than or equal to 11 nm and less than or equal to 25 nm).

In that case, the thickness of the first semiconductor film 102 is preferably greater than or equal to 10 nm and less than or equal to 20 nm, and the thickness of the second semiconductor film 104 is preferably greater than or equal to 1 nm and less than or equal to 5 nm. Note that, even when the thickness of the semiconductor film exceeds 20 nm, deposition is performed until pulsed discharge in the period T2 is completed.

Note that, in the above description of deposition conditions, deposition conditions of the first semiconductor film 102, the second semiconductor film 104, the third semiconductor film 106, and the fourth semiconductor film 108 are not distinguished. This is because when deposition of the first semiconductor film 102 to the fourth semiconductor film 108 is performed, only a plasma discharge method (continuous discharge or pulsed discharge) is changed and the other deposition conditions are not changed. Therefore, the manufacturing method in this embodiment has an advantage that operation of plasma discharge is easily conducted, repeated, and continued, as compared with a conventional deposition method including a plurality of steps in which a flow rate of a gas, substrate temperature, or the like is changed.

Note that the timing when deposition is completed is not limited to the above description, and deposition may be completed at the end of a period T3 during which continuous discharge is performed. Alternatively, deposition may be completed at the end of the period T2 during which pulsed discharge is performed.

Here, an example of a plasma CVD apparatus which can used for forming the microcrystalline semiconductor film will be described with reference to FIG. 6.

Figure 6:
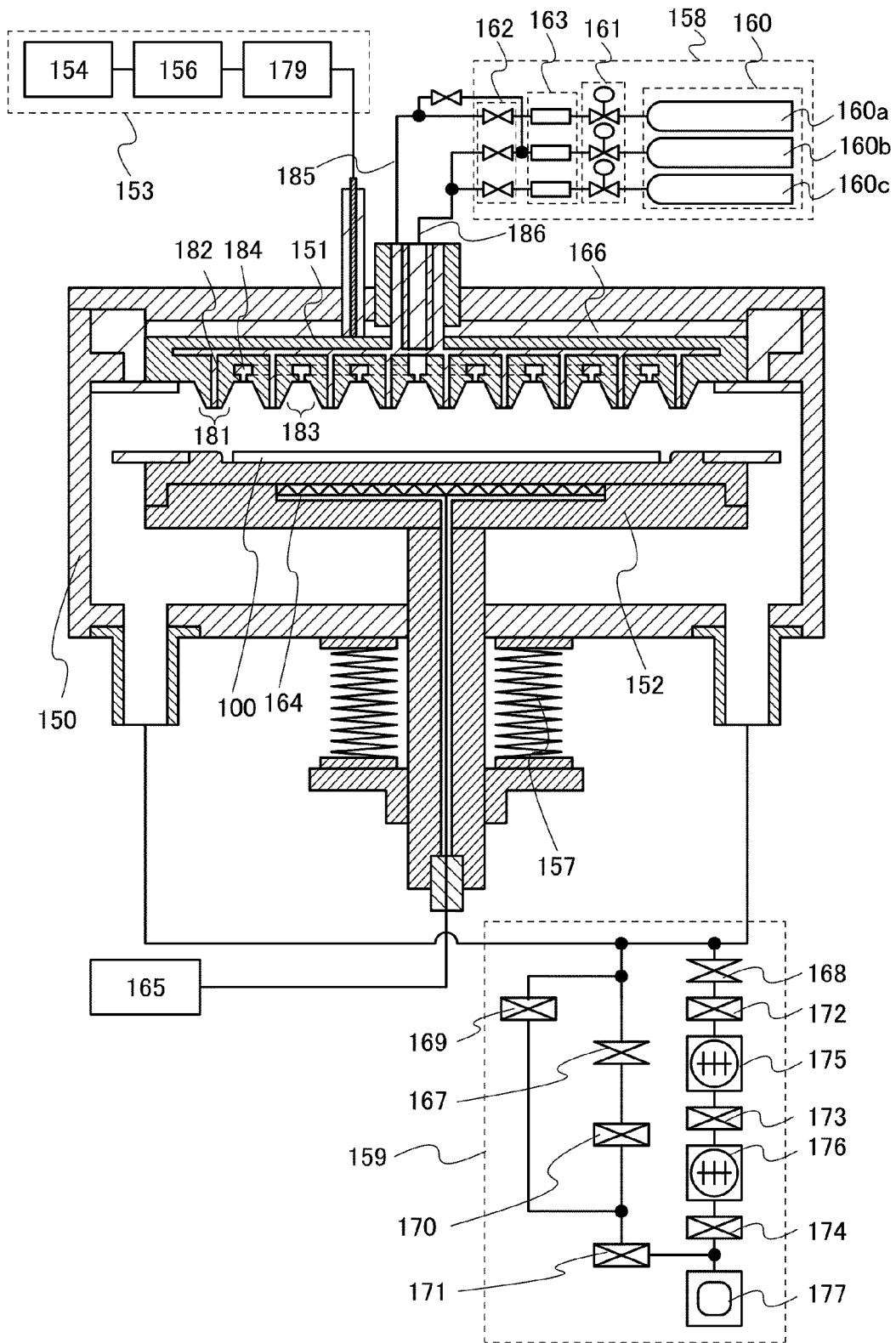
FIG. 6 is a view illustrating an example of a plasma CVD apparatus used for forming a microcrystalline semiconductor film.

FIG. 6 illustrates an example of a structure of a plasma CVD apparatus. A chamber wall of a reaction chamber 150 is formed using a stiff material such as aluminum or stainless steel and has a structure in which the inside of the reaction chamber 150 can be vacuum-evacuated. The reaction chamber 150 in this embodiment is an aluminum chamber. In the case of a chamber formed using a stiff material such as stainless steel, the chamber preferably has a structure capable of being disassembled for maintenance, whereby the inside of the reaction chamber can be regularly recoated with aluminum by thermal spraying. The reaction chamber 150 is provided with a first electrode 151 (also referred to as an upper electrode) and a second electrode 152 (also referred to as a lower electrode) facing to the first electrode 151.

A high-frequency power supply unit 153 is connected to the first electrode 151. The second electrode 152 is grounded, and a substrate can be placed on the second electrode 152. The first electrode 151 is insulated from the reaction chamber 150 by an insulating material 166 so that high-frequency power does not leak. In the case where, for example, a ceramic material is used as the insulating material 166, it is difficult to use a knife-edge-type metal-seal flange for sealing of the upper electrode and thus, an O-ring seal is preferably used.

In FIG. 6, a capacitively coupled type (a parallel plate type) structure including the first electrode 151 and the second electrode 152 is illustrated; however one embodiment of the present invention is not limited to this structure. Another structure such as an inductively coupled structure may be employed as long as the structure can generate glow discharge plasma in the reaction chamber 150 by supplying high-frequency power.

The first electrode 151 is an electrode that is projected and depressed by having projected portions 181 and depressed portions 183 arranged regularly, preferably at regular intervals. In other words, projected structure bodies constituting the projected portions 181 are arranged regularly, preferably at regular intervals. Further, hollow portions 182 connected to a gas supply unit 158 are provided in the projected portions 181 of the first electrode 151, and hollow portions 184 connected to the gas supply unit 158 are provided in the depressed portion 183 of the first electrode 151. In other words, the depressed portions 183 form a common plane where the gas supply ports are provided. With such a structure, the kind of gas supplied to the reaction chamber 150 from the projected portion 181 can be different from the kind of gas supplied to the reaction chamber 150 from the depressed portions 183. Here, the region having the gas supply port near a surface of the second electrode 152 is regarded as the projected portion 181, and the region having the gas supply port distant from the surface of the second electrode 152 is regarded as the depressed portion 183.

Here, the kinds of gases supplied through the hollow portions 182 and 184 may be determined as appropriate. A structure in which a deposition gas is supplied through the hollow portion 182 and an $H_2$ gas is supplied through the hollow portion 184 may be employed, for example. Alternatively, a structure in which an $H_2$ gas is supplied through the hollow portion 182 and a deposition gas is supplied through the hollow portion 184 may be employed. Further alternatively, a structure in which a mixed gas of a deposition gas and an $H_2$ gas is supplied through the hollow portion 182 and a deposition gas is supplied through the hollow portion 184 may be employed. Further alternatively, a structure in which a deposition gas is supplied through the hollow portion 182 and a mixed gas of a deposition gas and an $H_2$ gas is supplied through the hollow portion 184 may be employed. Further alternatively, a structure in which a mixed gas of a deposition gas and an $H_2$ gas is supplied through the hollow portion 182 and an $H_2$ gas is supplied through the hollow portion 184 may be employed. It is the most preferable that an $H_2$ gas be supplied through the hollow portion 182 and a mixed gas of a deposition gas and an $H_2$ gas be supplied through the hollow portion 184. By supplying an $H_2$ gas through the hollow portion 182 and a mixed gas of a deposition gas and an $H_2$ gas through the hollow portion 184, the crystallinity of a microcrystalline semiconductor film to be formed can be improved.

Note that the flow rate of a gas may be varied during film formation. For instance, the flow rate of a deposition gas is increased at the initial stage of film formation and the dilution rate is raised at the later stage of the film formation, whereby the crystallinity can be improved.

Here, the hollow portion 182 is connected to a cylinder 160a filled with a deposition gas containing silicon or germanium or a dilution gas and to a cylinder 160b filled with an $H_2$ gas which are provided in the gas supply unit 158, via a gas line 185. The hollow portion 184 is connected to the cylinder 160b filled with an $H_2$ gas and a cylinder 160c filled with a deposition gas containing silicon or germanium or a dilution gas which are provided in the gas supply unit 158, via a gas line 186.

The gas supply unit 158 includes a plurality of cylinders 160 (the cylinders 160a to 160c) filled with gases, a plurality of pressure adjusting valves 161, a plurality of stop valves 162, a plurality of mass flow controllers 163, and the like. Note that the cylinder 160c is not necessarily provided.

As examples of the deposition gas containing silicon or germanium, which fills the cylinder 160a and/or the cylinder 160c, a monosilane ($SiH_4$) gas, a disilane ($Si_2H_6$) gas, a germane ($GeH_4$) gas, and a digermane ($Ge_2H_6$) gas are given; however, another deposition gas can be used.

As the dilution gas, which fills the cylinder 160a and/or the cylinder 160c, Ar, xenon (Xe), krypton (Kr), or the like is given.

A substrate heater 164, a temperature of which is controlled by a heater controller 165, is provided in the second electrode 152. In the case where the substrate heater 164 is provided in the second electrode 152, a thermal conduction heating method is employed. For example, the substrate heater 164 may include a sheathed heater.

The high-frequency power supply unit 153 includes a high-frequency power source 154, a matching box 156, and a high-frequency cut filter 179. High-frequency power supplied from the high-frequency power source 154 is supplied to the first electrode 151.

The high-frequency power source 154 supplies high-frequency power at a frequency of 60 MHz or less. In the case where a large substrate of the seventh or later generation is used as a substrate placed on the second electrode 152, the high-frequency power source 154 preferably supplies high-frequency power at a wavelength of approximately 10 m or more. For example, high-frequency power at a frequency of 13.56 MHz or less, for example, greater than or equal to 3 MHz and less than or equal to 13.56 MHz, is preferably supplied. When the high-frequency power source 154 supplies high-frequency power at a frequency in the above range, even if a large substrate of the seventh or later generation is placed on the second electrode 152 and glow discharge is performed, plasma can be generated uniformly without the adverse effect of a surface standing wave; therefore, a high-quality and uniform film can be formed over an entire substrate even in the case of the large substrate.

In addition, when high-frequency power source supplies at a frequency of 13.56 MHz is used as the high-frequency power source 154, a variable capacitor with a capacitance of 10 pF to 100 pF is used for the high-frequency cut filter 179.

By further using a coil for the high-frequency cut filter 179, a parallel resonance circuit using a coil and a variable capacitor may be formed.

An evacuation unit 159 connected to the reaction chamber 150 has a function of vacuum evacuation and a function of adjusting the pressure inside the reaction chamber 150 to be kept at a predetermined pressure when a reactive gas is supplied. The evacuation unit 159 includes butterfly valves 167 and 168, stop valves 169 to 174, turbo molecular pumps 175 and 176, a dry pump 177, and the like. The turbo molecular pump 176 is connected to the dry pump 177 through the stop valve 174.

In the case where the reaction chamber 150 is vacuum evacuated, first, the stop valve 169 and the stop valve 171 for rough vacuum are opened and the reaction chamber 150 is evacuated with the dry pump 177. Then, the stop valve 169 is closed and the butterfly valve 167 and the stop valve 170 are opened for vacuum evacuation. In the case where ultrahigh vacuum evacuation is performed to obtain a pressure lower than $10^{-5}$ Pa in the reaction chamber 150, the reaction chamber 150 is evacuated with the dry pump, the butterfly valve 167 and the stop valves 170 and 171 are closed, the butterfly valve 168, stop valves 172, 173, and 174, and the turbo molecular pumps 175 and 176 are opened, and then vacuum evacuation is performed using the turbo molecular pumps 175 and 176 and the dry pump 177 which are connected in series. In addition, after the vacuum evacuation is performed, the reaction chamber 150 is preferably subjected to heat treatment so that degassing of the inner wall is performed.

A distance (also referred to as a gap) between the first electrode 151 and the second electrode 152 can be adjusted as appropriate. The gap between the electrodes can be adjusted in such a manner that the height of the second electrode 152 is changed in the reaction chamber 150. By using a bellows 157, the gap between the electrodes can be adjusted with the reaction chamber 150 maintained in a vacuum.

Figure 7:
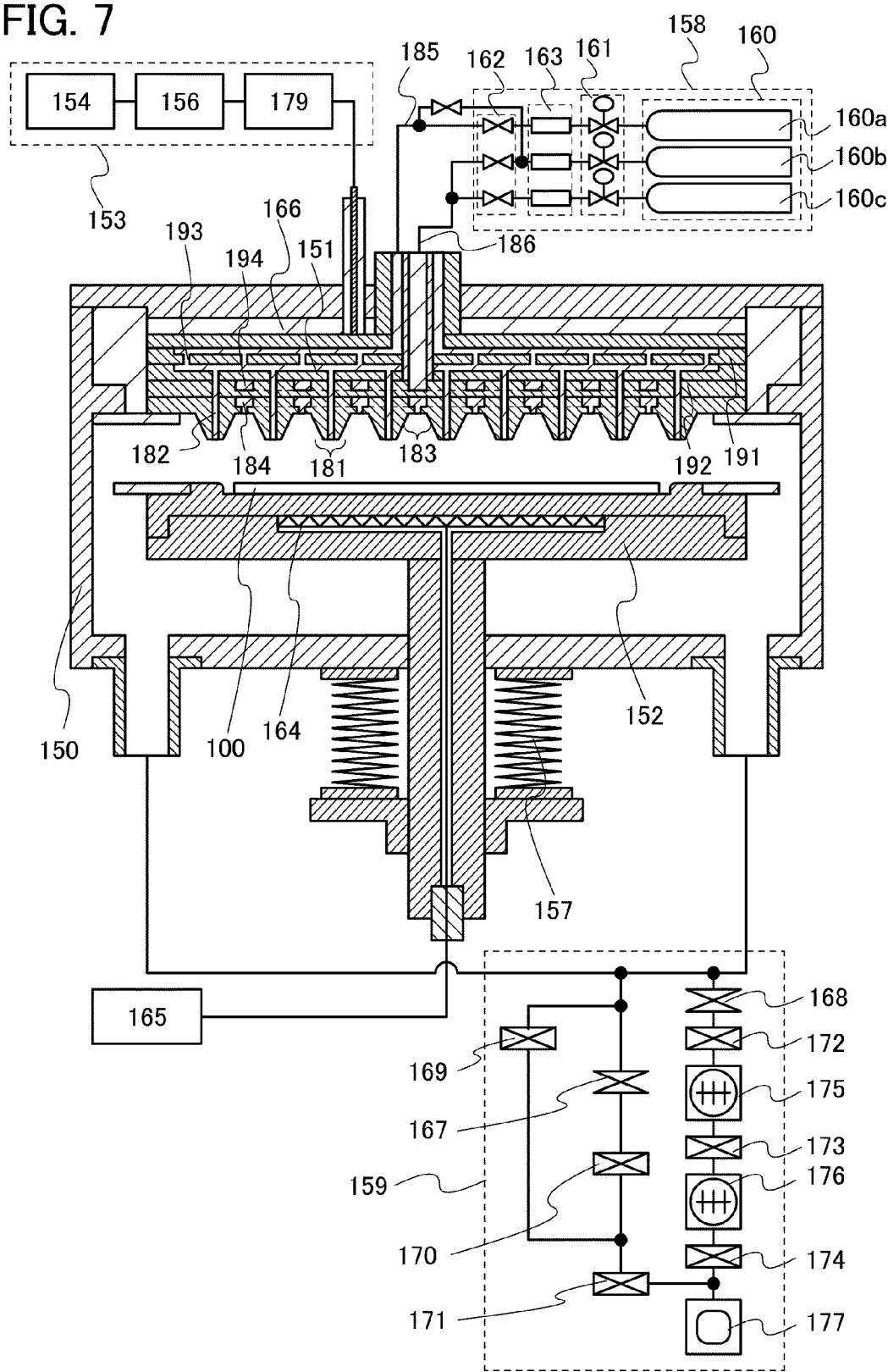
FIG. 7 is a view illustrating an example of a plasma CVD apparatus used for forming a microcrystalline semiconductor film.

Further, the first electrode 151 may include a plurality of diffusing plates (see FIG. 7). In FIG. 7, a gas supplied through the gas line 185 is diffused by a diffusing plate 191, passes through a through hole 193 of the diffusing plate 191, and then supplied to the reaction chamber 150 through an introduction port of the hollow portion 182 provided in the projected portion 181. Further, a gas supplied through the gas line 186 is diffused by a diffusing plate 192, passes through a through hole 194 of the diffusing plate 192, and then supplied to the reaction chamber 150 through an introduction port of the hollow portion 184 provided on the depressed portion 183. As illustrated in FIG. 7, when the first electrode 151 includes the diffusing plates 191 and 192, the gases introduced through the gas lines 185 and 186 are sufficiently diffused into the first electrode 151 and therefore a homogeneous gas can be supplied to the reaction chamber 150, whereby a high-quality and uniform film can be formed over a substrate.

Note that the structure of the plasma CVD apparatus used in the manufacturing method of the microcrystalline semiconductor film which is one embodiment of the present invention is not limited to the structures illustrated in FIG. 6 and FIG. 7. For example, a gas supply port may be provided in either a projected portion or a depressed portion. Alternatively, the first electrode 151 does not necessarily include a projected portion and a depressed portion. In other words, the first electrode 151 may be a parallel plate type electrode.

In the above-described manner, a microcrystalline semiconductor film can be formed.

Embodiment 2

In this embodiment, a manufacturing method of a semiconductor device which is one embodiment of the present invention will be described. The manufacturing method of a microcrystalline semiconductor film, which is described in Embodiment 1, is applied to a semiconductor device manufactured in this embodiment. A thin film transistor is exemplified as a semiconductor device described in this embodiment.

A thin film transistor of this embodiment includes a crystalline semiconductor. In general, an n-channel thin film transistor including a crystalline semiconductor has higher carrier mobility than a p-channel thin film transistor including a crystalline semiconductor. Further, when all thin film transistors formed over one substrate have the same polarity, the number of manufacturing steps can be reduced. Therefore, a method for manufacturing an n-channel thin film transistor is described here. However, one embodiment of the present invention is not limited thereto.

Figure 8A:
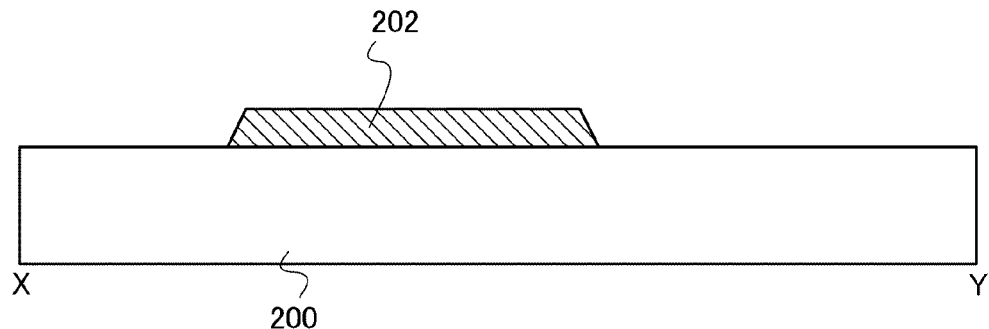
FIGS. 8A to 8C are views illustrating a manufacturing method of a semiconductor device.

First, a gate electrode layer 202 is formed over a substrate 200 (see FIG. 8A). As the substrate 200, any of the following substrates can be used: an alkali-free glass substrate formed of barium borosilicate glass, aluminoborosilicate glass, aluminosilicate glass, or the like by a fusion method or a float method; a ceramic substrate; a plastic substrate having heat resistance enough to withstand a process temperature of this manufacturing process; and the like. Alternatively, a metal substrate (e.g., a stainless steel alloy substrate) with a surface provided with an insulating layer may be used. There is no particular limitation on the substrate 200 as long as it has an insulating surface.

A gate electrode layer 202 is formed using a conductive material. As the conductive material, for example, a metal material such as Mo, Ti, Cr, Ta, W, Al, Cu, Nd, or Sc, or an alloy material containing any of these metal materials as its main component can be used. Alternatively, crystalline silicon to which an impurity element imparting one conductivity type is added may be used. The gate electrode layer 202 may have a single layer structure or a stacked structure of plural layers. For example, a two-layer structure in which a Ti layer or a Mo layer is stacked over an Al layer or a Cu layer, or a three-layer structure in which an Al layer or a Cu layer is interposed between Ti layers or Mo layers is preferably used. Instead of a Ti layer, a titanium nitride layer may be used.

Note that in this specification, Mo refers to molybdenum; Ti, titanium; Cr, chromium; Ta, tantalum; W, tungsten; Al, aluminum; Cu, copper; Nd, neodymium; Sc, scandium; Ag, silver; and Au, gold.

The gate electrode layer 202 can be formed in the following manner: a conductive film is formed over the substrate 200 by a sputtering method or a vacuum evaporation method; a resist mask is formed over the conductive film by a photolithography method, an ink jet method, or the like; and then the conductive film is etched using the resist mask. Alternatively, the gate electrode layer 202 can be formed in such a manner that a conductive nanopaste of Ag, Au, Cu, or the like is discharged over the substrate by an ink-jet method and the conductive nanopaste is baked. Note that as a barrier metal for increasing adhesion between the gate electrode layer 202 and the substrate 200 and preventing a material used for the gate electrode layer 202 from diffusing to a base, a nitride layer of any of the above-described metal materials may be provided between the substrate 200 and the gate electrode layer 202. Here, a conductive film is formed over the substrate 200 and is etched using a resist mask formed with the use of a photomask.

The gate electrode layer 202 is preferably processed into a tapered shape. This is because at least a semiconductor layer and a source wiring (a signal line) are to be formed over the gate electrode layer 202 in a later step. At this step, a gate wiring (a scan line) can be formed at the same time. Note that a "scan line" refers to a wiring to select a pixel.

Figure 8B:
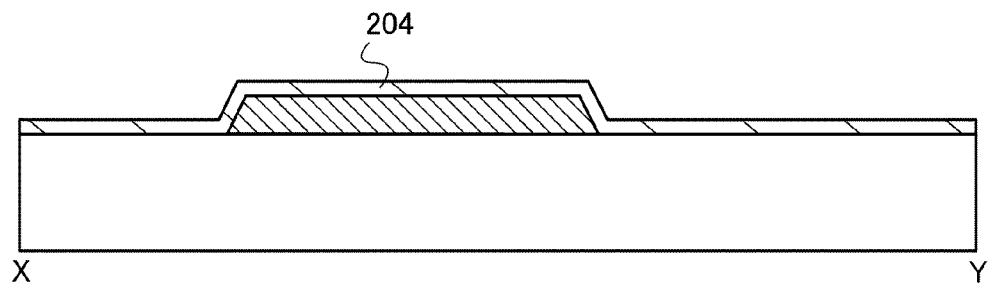

Next, a gate insulating layer 204 is formed to cover the gate electrode layer 202 (see FIG. 8B). The gate insulating layer 204 can be formed using silicon nitride, for example, by a CVD method, a sputtering method, or the like. Although the gate insulating layer 204 can be formed using silicon nitride oxide, silicon oxynitride, or silicon oxide, at least a surface of the gate insulating layer 204 is formed using silicon nitride. The gate insulating layer 204 is formed to a thickness greater than or equal to 50 nm, preferably greater than or equal to 50 nm and less than or equal to 400 nm, further preferably greater than or equal to 150 nm and less than or equal to 300 nm. However, the thickness of the gate insulating layer 204 is not limited thereto and may be adjusted as appropriate depending on characteristics of a transistor to be manufactured. Note that a plasma CVD apparatus with a high frequency (e.g., 1 GHz or higher) is preferably used for forming the gate insulating layer 204 because a dense silicon nitride layer can be formed.

In this specification, silicon oxynitride contains more oxygen than nitrogen, and in the case where measurements are performed using Rutherford backscattering spectrometry (RBS) and hydrogen forward scattering spectrometry (HFS), silicon oxynitride contains oxygen, nitrogen, silicon, and hydrogen as composition ranging from 50 atomic % to 70 atomic %, 0.5 atomic % to 15 atomic %, 25 atomic % to 35 atomic %, and 0.1 atomic % to 10 atomic %, respectively.

Further, silicon nitride oxide contains more nitrogen than oxygen, and in the case where measurements are conducted using RBS and HFS, silicon nitride oxide contains oxygen, nitrogen, silicon, and hydrogen as composition ranging from 5 atomic % to 30 atomic %, 20 atomic % to 55 atomic %, 25 atomic % to 35 atomic %, and 10 atomic % to 30 atomic %, respectively. Note that percentages of nitrogen, oxygen, silicon, and hydrogen fall within the ranges given above, where the total number of atoms contained in the silicon oxynitride or the silicon nitride oxide is defined as 100 atomic %.

Figure 8C:
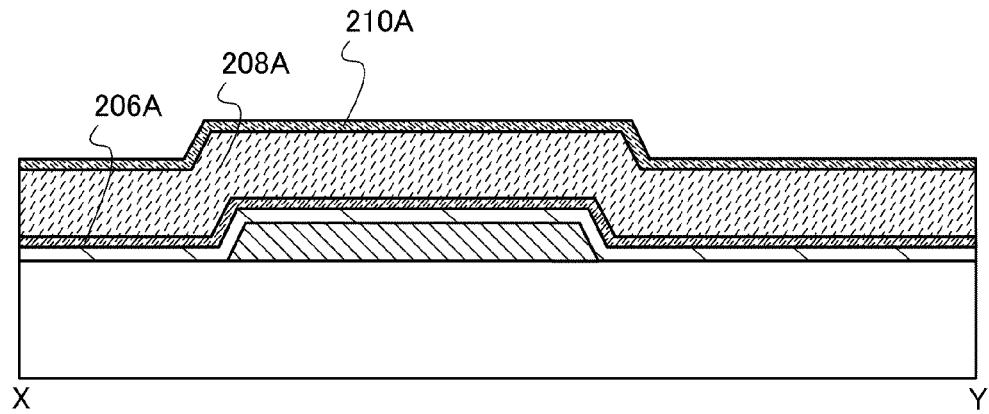
Figure 11:
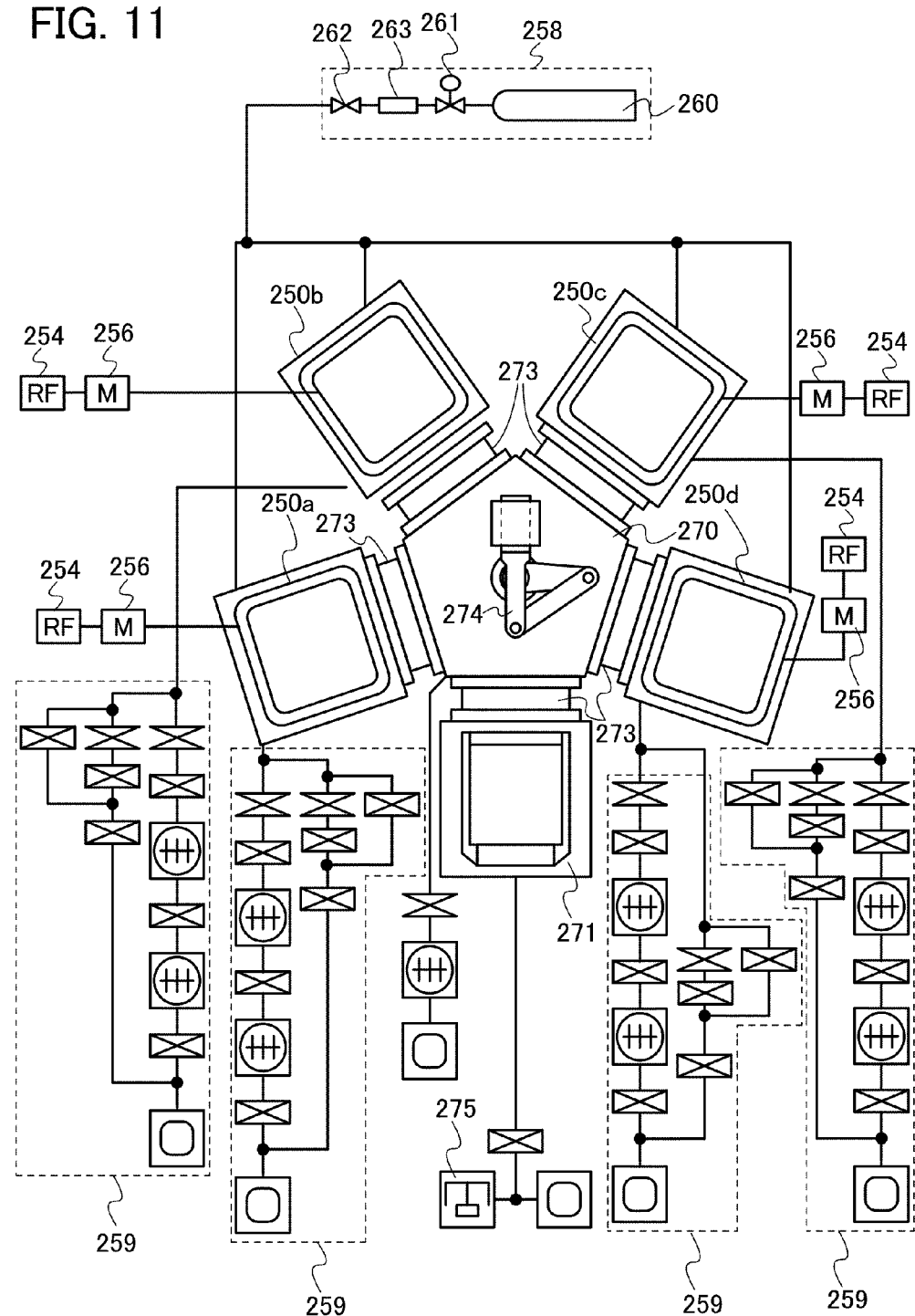
FIG. 11 is a view illustrating an apparatus used for manufacturing a semiconductor device.

Next, a first semiconductor film 206A, a second semiconductor film 208A, and an impurity semiconductor film 210A are formed over the gate insulating layer 204 (See FIG. 8C). It is preferable that the gate insulating layer 204, the first semiconductor film 206A, the second semiconductor film 208A, and the impurity semiconductor film 210A be formed successively in one reaction chamber without being exposed to the atmosphere. However, one embodiment of the present invention is not limited thereto, and the gate insulating layer 204 may be exposed to the atmosphere before the first semiconductor film 206A is formed, for example. Moreover, plasma treatment may be performed after the gate insulating layer 204 is exposed to the atmosphere. FIG. 11 is an example of a schematic view of a structure of a multi-chamber plasma CVD apparatus. When film formation is performed continuously or when exposure to the atmosphere is performed, as described above, the multi-chamber plasma CVD apparatus illustrated in FIG. 11 can be used.

FIG. 11 is a schematic diagram illustrating an example of a multi-chamber plasma CVD apparatus provided with a plurality of reaction chambers. The apparatus is provided with a common chamber 270, a load/unload chamber 271, a first reaction chamber 250a, a second reaction chamber 250b, a third reaction chamber 250c, and a fourth reaction chamber 250d. This multi-chamber plasma CVD apparatus is a single-wafer processing type apparatus in which a substrate set in a cassette in the load/unload chamber 271 is carried in and out of each reaction chamber by a transport mechanism 274 of the common chamber 270. A gate valve 273 is provided between the common chamber 270 and each reaction chamber so that treatment conducted in the reaction chambers does not interfere with each other.

The second reaction chamber 250b is preferably similar to the reaction chamber 150 illustrated in FIG. 6. That is, the upper electrode of the second reaction chamber 250b is preferably provided with a projected portion or a depressed portion.

Note that the plasma CVD apparatus in which the upper electrode is provided with a projected portion or a depressed portion as illustrated in FIG. 6 can be used for forming a gate insulating layer. When such a plasma CVD apparatus is used for forming a gate insulating layer, the gate insulating layer 204 can be uniform and have high quality, whereby a highly reliable thin film transistor can be manufactured.

The plurality of reaction chambers of the multi-chamber plasma CVD apparatus illustrated in FIG. 11 are separately used for forming different kinds of thin films. Needless to say, the number of reaction chambers is not limited thereto and can be increased or decreased as appropriate. One film may be formed in one reaction chamber, or a plurality of films may be formed in one reaction chamber.

An evacuation unit 259 is connected to each reaction chamber of the multi-chamber plasma CVD apparatus illustrated in FIG. 11. The evacuation unit 259 is not limited to a combination of the vacuum pumps illustrated in FIG. 11, and another vacuum pump can be used as long as the vacuum pump can perform evacuation to a degree of vacuum within the range of approximately $10^{-5}$ Pa to $10^{-1}$ Pa.

A cryopump 275 capable of that can perform ultra-high vacuum evacuation may be connected to the load/unload chamber 271. With use of the cryopump 275, the pressure in the load/unload chamber 271 can be evacuated to an ultra-high vacuum of a pressure lower than $10^{-5}$ Pa, and atmospheric components contained in a film formed over a substrate in the reaction chamber can be reduced. Further, the pumping speed of the cryopump 275 is higher than that of either the turbo molecular pump or the dry pump; therefore, by connecting the cryopump 275 to the load/unload chamber 271 that is opened and closed frequently, the throughput can be increased.

A gas supply unit 258 includes cylinders 260 filled with gases, a pressure adjusting valve 261, a stop valve 262, a mass flow controller 263, and the like. Although not illustrated here, the cylinders filled with gases include a cylinder filled with a deposition gas containing silicon or germanium, a cylinder filled with an $H_2$ gas, a cylinder filled with a dilution gas, a cylinder filled with a reactive gas (e.g., an oxidizing gas, a nitriding gas, or a halogen gas), a cylinder filled with a gas containing an impurity element imparting one conductivity type, or the like.

A high-frequency power supply unit for generating plasma is connected to each reaction chamber of the multi-chamber plasma CVD apparatus illustrated in FIG. 11. The high-frequency power supply unit includes at least a high-frequency power source 254 and a matching box 256.

The reaction chambers of the multi-chamber plasma CVD apparatus illustrated in FIG. 11 can be separately used for forming different kinds of thin films. Since the optimal deposition temperatures vary between thin films, the reaction chambers are separately used so that the deposition temperatures of films to be formed can be controlled easily. In addition, the same kind of films can be deposited repeatedly; therefore, the influence of residual impurities due to a film which has been formed can be eliminated.

In order to control the threshold voltage ($V_{th}$), an impurity element imparting p-type conductivity (e.g., boron) may be added to the first semiconductor film 206A serving as a channel formation region of the thin film transistor at the same time as or after formation of the first semiconductor film 206A. An example of the impurity element imparting p-type conductivity is boron, and a gas containing an impurity element, such as $B_2H_6$ or $BF_3$, can be mixed into silicon hydride at a proportion of 1 ppm to 1000 ppm, preferably 1 ppm to 200 ppm. The concentration of boron included in the first semiconductor film 206A is preferably higher than or equal to $1\times10^{14}$ atoms/cm$^3$ and lower than or equal to $6\times10^{16}$ atoms/cm$^3$, for example.

Here, the second semiconductor film 208A serves as a high resistance region, and thus can reduce off-state current of the thin film transistor and can improve switching characteristics of the thin film transistor. When a thin film transistor with high switching characteristics is used as, for example, a switching element of a liquid crystal display device, contrast of the liquid crystal display device can be improved. Note that the second semiconductor film 208A preferably includes an NH group or an $NH_2$ group. When the second semiconductor film 208A includes an NH group or an $NH_2$ group, dangling bonds can be cross-linked; accordingly, on-state current can be increased with off-state current suppressed. Note that an $NH_3$ (ammonia) gas may be contained in a gas used for forming the second semiconductor film 208A so that an NH group or an $NH_2$ group is included in the second semiconductor film 208A.

The second semiconductor film 208A preferably includes an amorphous structure and minute crystal grains. The second semiconductor film 208A has a low energy at an urbach edge measured by constant photocurrent method (CPM) or photoluminescence spectroscopy and a small amount of defect absorption spectrum, as compared with a conventional amorphous semiconductor. That is, as compared with the conventional amorphous semiconductor, such a semiconductor layer is a well-ordered semiconductor layer which has less defects and whose tail slope of a level at a band edge (a mobility edge) in the valence band is steep. Such a semiconductor layer can be formed under conditions similar to those of formation of a crystalline semiconductor layer and by making a source gas contain nitrogen.

Note that the second semiconductor film 208A is not limited thereto and may be formed using an amorphous semiconductor. The second semiconductor film 208A is formed using a material whose carrier mobility is lower than at least that of the first semiconductor film 206A. Even when the second semiconductor film 208A is formed using an amorphous semiconductor, an NH group or an $NH_2$ group may be included.

The first semiconductor film 206A may be formed to a thickness greater than or equal to 11 nm and less than or equal to 50 nm, preferably greater than or equal to 11 nm and less than or equal to 25 nm, as described in Embodiment 1. The second semiconductor film 208A may be formed to a thickness greater than or equal to 10 nm and less than or equal to 500 nm. The thicknesses of these films can be adjusted by a flow rate of a deposition gas and formation time, for example.

It is preferable that an impurity element imparting one conductivity type, such as phosphorus or boron, be not contained in the second semiconductor film 208A. Alternatively, in the case where phosphorus, boron or the like is contained in the second semiconductor film 208A, the concentration of phosphorus, boron or the like may be adjusted to be a lower detection limit of secondary ion mass spectrometry (SIMS) or lower. For example, in the case where boron is contained in the first semiconductor film 206A and phosphorus is contained in the second semiconductor film 208A, a PN junction is formed between the first semiconductor film 206A and the second semiconductor film 208A. In addition, in the case where boron is contained in the second semiconductor film 208A and phosphorus is contained in source and drain regions 210, a PN junction is formed between the second semiconductor film 208A and the source and drain regions 210. Alternatively, in the case where both boron and phosphorus are contained in the second semiconductor film 208A, a recombination center is generated, which causes leakage current. The second semiconductor film 208A which does not contain an impurity element such as phosphorus and boron is provided between the impurity semiconductor film 210A serving as the source and drain regions 210 and the first semiconductor film 206A, so that an impurity element can be prevented from entering the first semiconductor film 206A serving as a channel formation region.

The impurity semiconductor film 210A is processed in a later step so that the source and drain regions 210 are formed. The source and drain regions 210 are provided in order that a second semiconductor layer 208 and source and drain electrode layers 212 have ohmic contact with each other. The impurity semiconductor film 210A can be formed by making a source gas contain an impurity element imparting one conductivity type. In the case where an n-channel thin film transistor is formed, for example, phosphorus may be added as the impurity element and a gas containing an impurity element imparting n-type conductivity, such as phosphine ($PH_3$), may be added to silicon hydride. In the case where a p-channel thin film transistor is formed, for example, boron may be added as the impurity element and a gas containing an impurity element imparting p-type conductivity, such as diborane ($B_2H_6$), may be added to silicon hydride.

The impurity semiconductor film 210A which is to be the source and drain regions 210 may be formed using either a crystalline semiconductor or an amorphous semiconductor, but preferably formed using a crystalline semiconductor because on-state current is increased when the source and drain regions 210 are formed using a crystalline semiconductor. The source and drain regions 210 is preferably formed to a thickness greater than or equal to 2 nm and less than or equal to 60 nm.

In this manner, components including the gate insulating layer 204 to the impurity semiconductor film 210A which is to be the source and drain regions 210 can be formed.

Figure 9A:
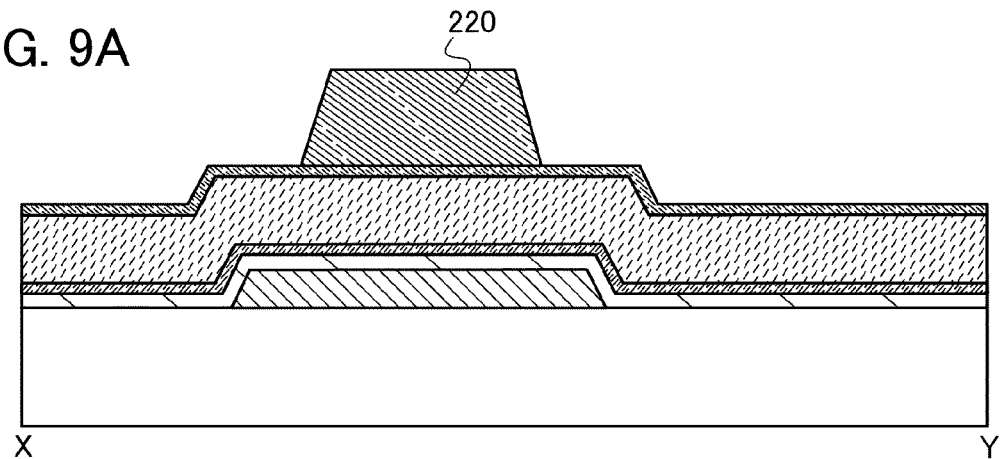
FIGS. 9A to 9C are views illustrating the manufacturing method of the semiconductor device.

Next, a resist mask 220 is formed over the impurity semiconductor film 210A (see FIG. 9A). The resist mask 220 can be formed by a photolithography method. Alternatively, the resist mask 220 may be formed by an ink-jet method or the like.

Figure 9B:
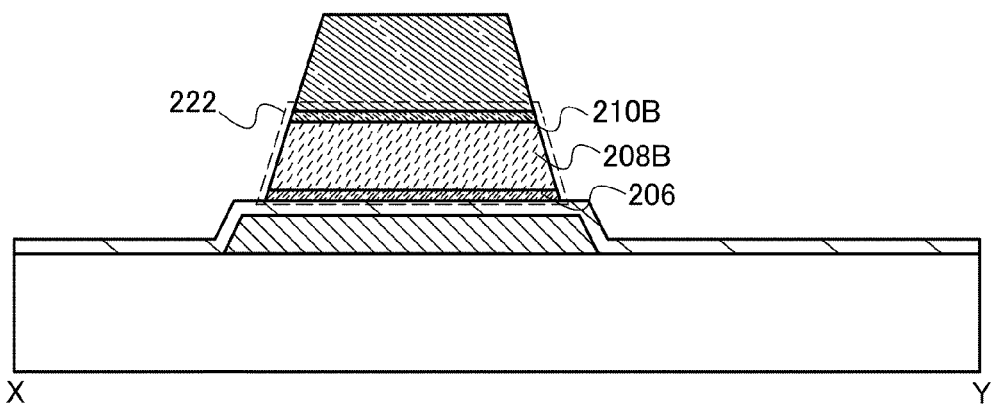

Then, the first semiconductor film 206A, the second semiconductor film 208A, and the impurity semiconductor film 210A are etched using the resist mask 220 to be separated corresponding to each element, so that a stack 222 including a first semiconductor layer 206, second semiconductor layer 208B, and an impurity semiconductor layer 210B is formed (see FIG. 9B). After that, the resist mask 220 is removed.

Note that this etching treatment is preferably performed so that side surfaces of the stack 222 including the first semiconductor layer 206, the second semiconductor layer 208B, and the impurity semiconductor layer 210B have a tapered shape. The taper angle is greater than or equal to 30° and less than or equal to 90°, preferably greater than or equal to 40° and less than or equal to 80°. With the tapered side surface, coverage with a layer to be formed thereover (e.g., a wiring layer) in a later step can be improved. Thus, disconnection or the like caused by a step portion can be prevented.

Figure 9C:
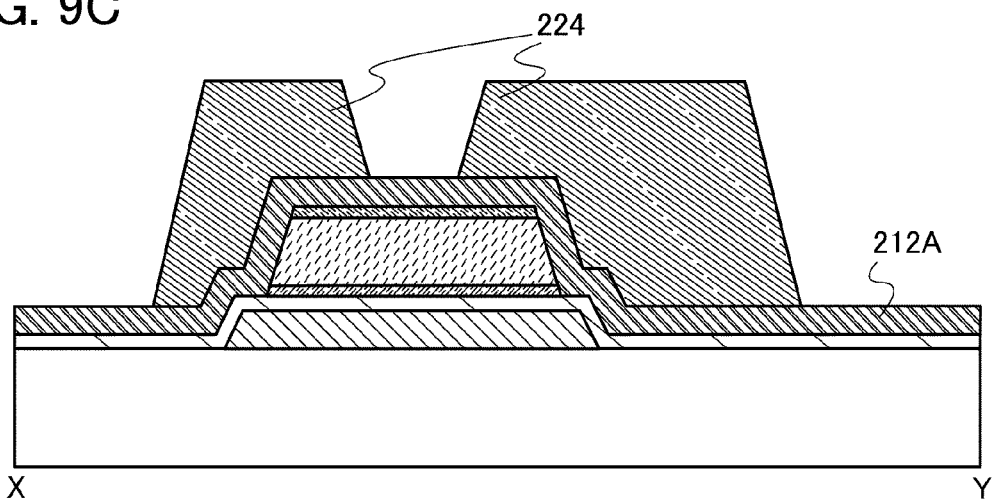

Next, a conductive film 212A is formed over the impurity semiconductor layer 210B and the gate insulating layer 204 (see FIG. 9C). The conductive film 212A is processed in a later step to form the source and drain electrode layers 212. There is no particular limitation on the conductive film 212A as long as it is formed using a conductive material. As the conductive material, for example, a metal material such as Mo, Ti, Cr, Ta, W, Al, Cu, Nd, or Sc, or an alloy material containing any of these metal materials as its main component can be used. Alternatively, crystalline silicon to which an impurity element imparting one conductivity type is added may be used. Note that the conductive film 212A may have a single-layer structure or a stacked structure of plural layers. For example, a two-layer structure in which a Ti layer or a Mo layer is stacked over an Al layer or a Cu layer, or a three-layer structure in which an Al layer or a Cu layer is interposed between Ti layers or Mo layers is preferably used. Instead of a Ti layer, a titanium nitride layer may be used.

The conductive film 212A is formed by a sputtering method, a vacuum evaporation method, or the like. Alternatively, the conductive film 212A may be formed by discharging a conductive nanopaste of Ag, Au, Cu, or the like by a screen printing method, an ink-jet method, or the like and baking it.

Next, a resist mask 224 is formed over the conductive film 212A (see FIG. 9C). In a manner similar to that of the resist mask 220, the resist mask 224 is formed by a photolithography method or an ink-jet method.

Figure 10A:
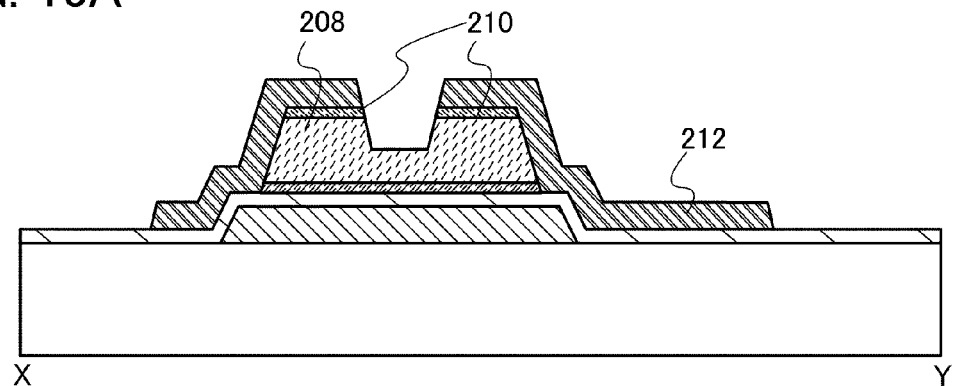
FIGS. 10A to 10C are views illustrating the manufacturing method of the semiconductor device.

Next, the conductive film 212A is etched using the resist mask 224 to form the source and drain electrode layers 212 (see FIG. 10A). Although dry etching is used here, wet etching may be employed. The source and drain electrode layers 212 form not only a source electrode and a drain electrode of the thin film transistor but also a signal line.

Next, the impurity semiconductor layer 210B and the second semiconductor layer 208B are etched in a state where the resist mask 224 is formed so that the source and drain regions 210 and the second semiconductor layer 208 having a depressed portion in a back channel portion are formed (see FIG. 10A).

At this time, dry etching using a gas including $O_2$ may be conducted as the etching. With use of the gas containing $O_2$, the impurity semiconductor layer 210B and the second semiconductor layer 208B can be etched while the resist mask is being reduced, so that the source and drain regions 210 and the second semiconductor layer 208 can have a tapered shape. As the etching gas, for example, an etching gas in which an oxygen ($O_2$) gas is mixed into a tetrafluoromethane ($CF_4$) gas or an etching gas in which an $O_2$ gas is mixed into a chlorine ($Cl_2$) gas is preferably used. When the side surfaces of the source and drain regions 210 and the second semiconductor layer 208 have a tapered shape, electric field concentration can be prevented and off-state current can be reduced. As an example, the etching can be conducted as follows: a gas flow rate of $CF_4$:$O_2$ is 45:55 (sccm), a pressure in a chamber is 2.5 Pa, a temperature of a sidewall in the chamber is about 70° C., an RF (13.56 MHz) electric power of 500 W is applied to a coiled electrode to generate plasma, and an RF (13.56 MHz) electric power of 200 W is applied to the substrate side, so that negative bias power is substantially applied and self-bias voltage is generated.

The second semiconductor layer 208 has a depression portion (the back channel portion) which is formed by etching. Etching is preferably performed so that at least part of the second semiconductor layer 208, which overlaps with the back channel portion, remains after the etching. Portions of the second semiconductor layer 208 which overlap with the source and drain regions 210 are not etched in the process of forming the source and drain regions 210, and have a thickness approximately greater than or equal to 80 nm and less than or equal to 500 nm, preferably greater than or equal to 150 nm and less than or equal to 400 nm, and further preferably greater than or equal to 200 nm and less than or equal to 300 nm. When the second semiconductor layer 208 is formed to have a sufficient thickness as described above, atmospheric components or the like can be prevented from entering the first semiconductor layer. In this manner, the second semiconductor layer 208 also serves as a protection layer of the first semiconductor layer 206.

After that, the resist mask 224 is removed (see FIG. 10A).

Note that a residual by-product generated in the etching step, a residue of the resist mask, substances which may be contamination sources in an apparatus which is used for removal of the resist mask, and a component of a resist-remover are attached or deposited on the back channel portion, which contributes to an increase in off-state current. For the purpose of removing them, etching is preferably performed under conditions which cause less damage; further preferably, dry etching without bias is performed. Alternatively, plasma treatment or cleaning may be performed on the back channel portion. Alternatively, these steps may be combined.

Through the above steps, the thin film transistor can be manufactured.

Note that the thin film transistor described above can be used as a pixel transistor of a display device. The subsequent steps will be described below.

Figure 10B:
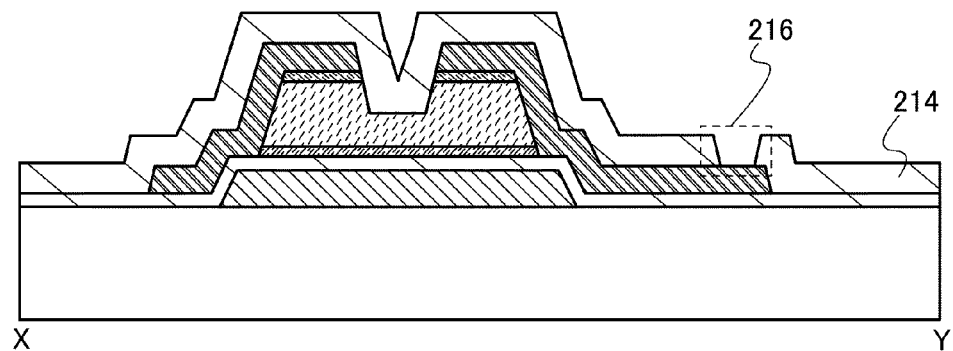

First, an insulating layer 214 is formed to cover the thin film transistor manufactured in the above manner (see FIG. 10B). Although the insulating layer 214 can be formed in a manner similar to that of the gate insulating layer 204, it is particularly preferable to use silicon nitride for forming the gate insulating layer 214. In particular, a dense silicon nitride layer is preferably used as the insulating layer 214 so that entry of substances which may be contamination sources such as an organic substance, metal, and moisture contained in the atmosphere can be prevented. When a silicon nitride layer is formed by a high frequency (specifically, 13.56 MHz or higher) plasma CVD method, a dense silicon nitride layer can be formed.

Figure 10C:
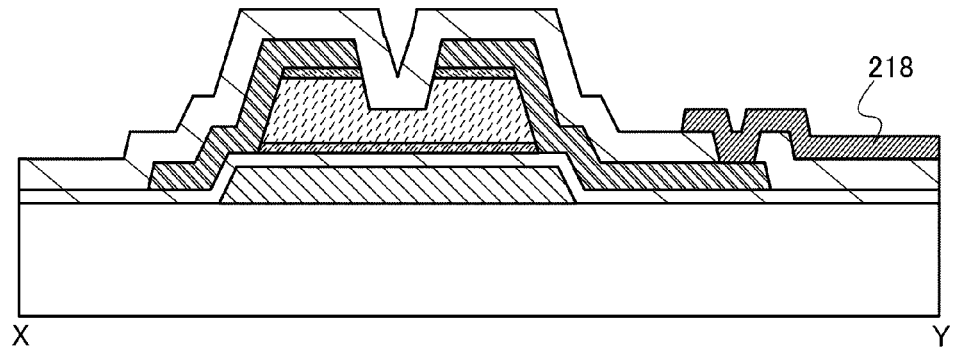

Note that the insulating layer 214 has an opening 216 which reaches the source and drain electrode layers 212, and one of the source and drain electrode layers 212 is connected to a pixel electrode layer 218 through the opening 216 provided in the insulating layer 214 (see FIG. 10C).

A conductive composition including a conductive high molecule (also referred to as a conductive polymer) having a light-transmitting property can be used for the pixel electrode layer 218. The pixel electrode layer 218 formed using such a conductive composition preferably has a sheet resistance of 10000 Ω/square or lower and a light transmittance of 70% or higher at a wavelength of 550 nm. Further, the resistivity of the conductive high molecule included in the conductive composition is preferably less than or equal to 0.1 Ω·cm.

As the conductive high molecule, a "π-electron conjugated conductive high molecule" can be used. Examples of the π-electron conjugated conductive high molecule are polyaniline; a derivative of polyaniline; polypyrrole; a derivative of polypyrrole; polythiophene; a derivative of polythiophene; a copolymer of two or more of aniline, pyrrole, and thiophene; and a derivative of such a copolymer.

The pixel electrode layer 218 can be formed using, for example, indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, or the like.

The pixel electrode layer 218 may be formed in a manner similar to that of the source and drain electrode layers 212 or the like, that is, a conductive layer is formed over the entire insulating layer 214 and etched using a resist mask or the like.

Although not illustrated, an insulating layer formed using an organic resin by a spin coating method or the like may be provided between the insulating layer 214 and the pixel electrode layer 218.

Note that in the above description, the gate electrode and the scan line are formed in the same step and the source and drain electrodes and the signal line are formed in the same step. However, one embodiment of the present invention is not limited thereto. An electrode and a wiring connected to the electrode may be formed in different steps.

Note that the manufacturing method of the thin film transistor of this embodiment is not limited to the above description. For example, with use of a multi-tone mask, a resist mask having a plurality of regions whose thicknesses are different (a resist mask having unevenness) may be formed, and the resist mask may be used. That case will be briefly described below.

A multi-tone mask is a mask capable of light exposure with multi-level light intensity, for example, light exposure with three levels of light intensity to provide an exposed region, a semi-exposed region, and an unexposed region. By one-time light exposure and development process with use of the multi-tone mask, a resist mask with plural thicknesses (for example, two levels of thicknesses) can be formed. Therefore, the use of a multi-tone mask can reduce the number of photomasks. As the multi-tone mask, a gray-tone mask in which a diffraction grating portion forms a semi-exposed region or a half-tone mask in which a semi-transmissive film forms a semi-exposed region can be used.

Figure 12A:
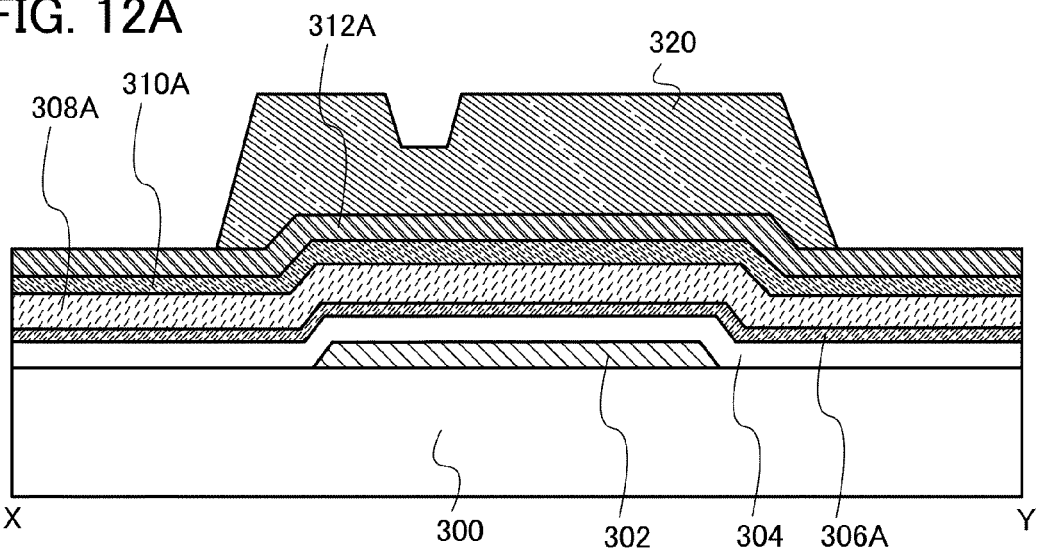
FIGS. 12A to 12C are views illustrating a manufacturing method of a semiconductor device.

First, a gate insulating layer 304 is formed so as to cover a gate electrode layer 302 provided over a substrate 300, and a first semiconductor film 306A, a second semiconductor film 308A, and an impurity semiconductor film 310A are formed over the gate insulating layer 304. Then, a conductive film 312A is formed over the impurity semiconductor film 310A, and a resist mask 320 having a plurality of regions whose thicknesses are different is formed over the conductive film 312A (see FIG. 12A).

In the resist mask 320, a projected portion (a thick portion) is formed in a region where a source and drain electrode layers 312 are formed, and a depressed portion (a thin portion) is formed in a region where the source and drain electrode layers 312 are not formed and part of the semiconductor layer is exposed.

Figure 12B:
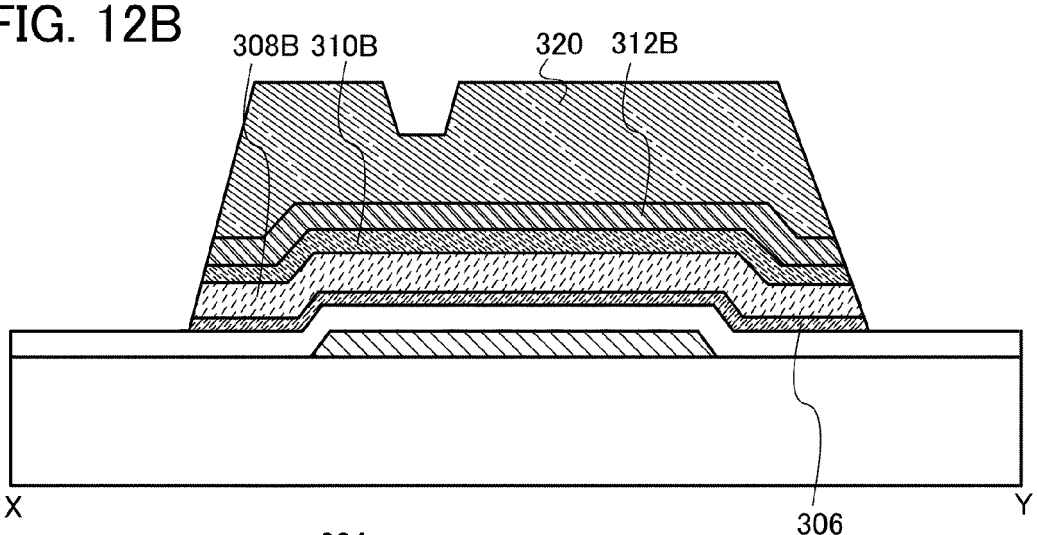

Next, patterning is performed using the resist mask 320 so that a first semiconductor layer 306, a second semiconductor layer 308B, an impurity semiconductor layer 310B, and a conductive layer 312B are formed (see FIG. 12B).

Then, the resist mask 320 is reduced (downsized) to form resist masks 324 (see FIG. 12B). In order to reduce (downsize) the resist mask 320, ashing using oxygen plasma may be performed. The etching conditions or the like is similar to that of Embodiment 1.

Figure 12C:
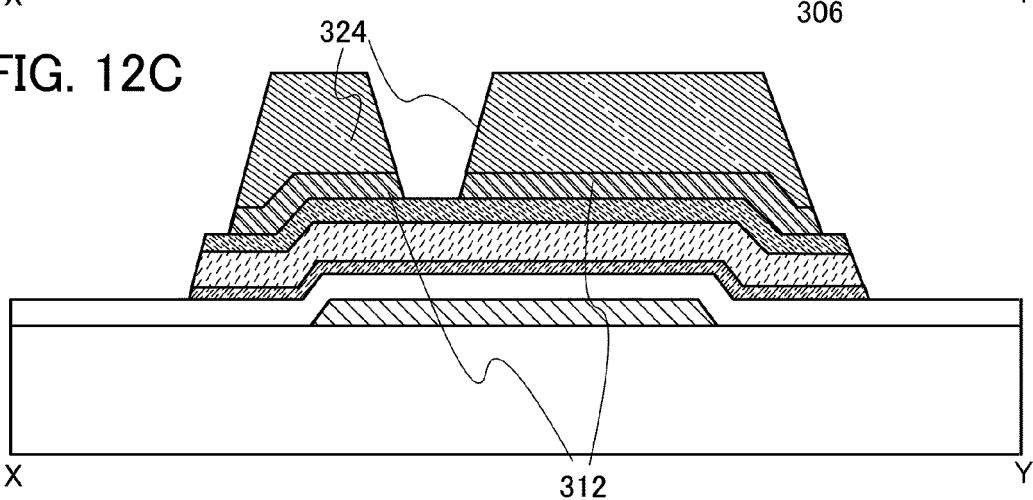

Next, the conductive layer 312B is etched using the resist masks 324 to form the source and drain electrode layers 312 (see FIG. 12C). Although dry etching is used here, wet etching may be employed.

Figure 13A:
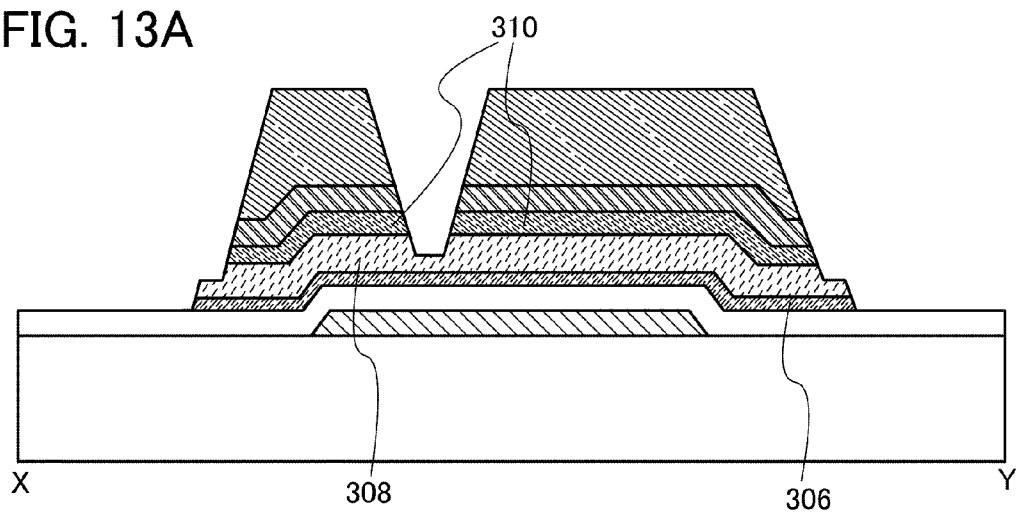
FIGS. 13A and 13B are views illustrating the manufacturing method of the semiconductor device.

After that, the impurity semiconductor layer 310B and the second semiconductor layer 308B are partly etched to form source and drain regions 310 and a second semiconductor layer 308 having a depressed back channel portion (see FIG. 13A).

Figure 13B:
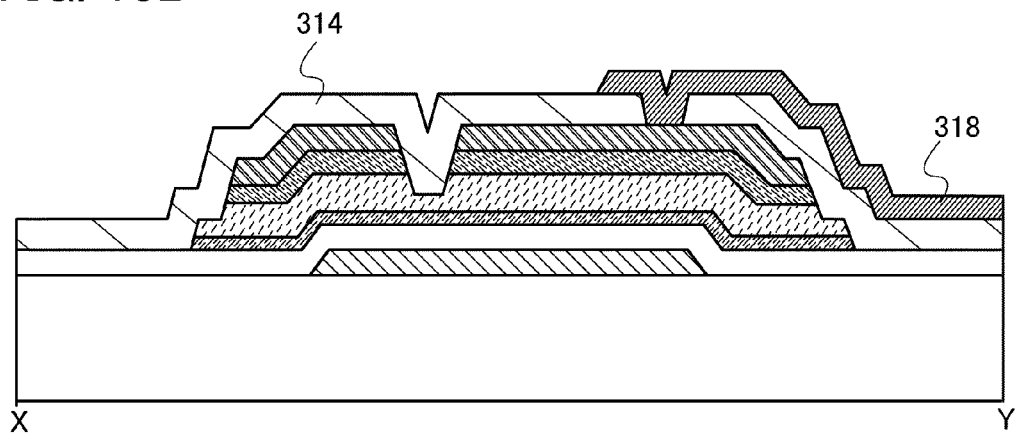

After that, the resist mask 324 is removed and an insulating layer 314 having an opening and a pixel electrode layer 318 are formed; thus, a pixel transistor can be manufactured (see FIG. 13B).

As described above, the use of a multi-tone mask can reduce the number of photomasks.

In the manner described in this embodiment, an array substrate of the display device which is one embodiment of the present invention can be manufactured.

Therefore, a display panel or a light-emitting panel can be manufactured with use of the array substrate of the display device manufactured according to this embodiment, and can be incorporated in the display device.

Embodiment 3

The thin film transistor and the display device described in Embodiments 1 and 2 can be applied to a variety of electronic devices (including an amusement machine). Examples of the electronic devices are a television set (also referred to as a television or a television receiver), a monitor of a computer, electronic paper, a camera such as a digital camera or a digital video camera, a digital photo frame, a mobile phone (also referred to as a mobile telephone or a mobile phone device), a portable game console, a portable information terminal, an audio reproducing device, a large-sized game machine such as a pachinko machine, and the like.

The display device described in Embodiment 2 can be applied to electronic paper, for example. Electronic paper can be used for electronic devices of a variety of fields as long as they can display data. For example, electronic paper can be applied to an electronic book (e-book) device, a poster, an advertisement in a vehicle such as a train, displays of various cards such as a credit card, and the like.

Figure 14A:
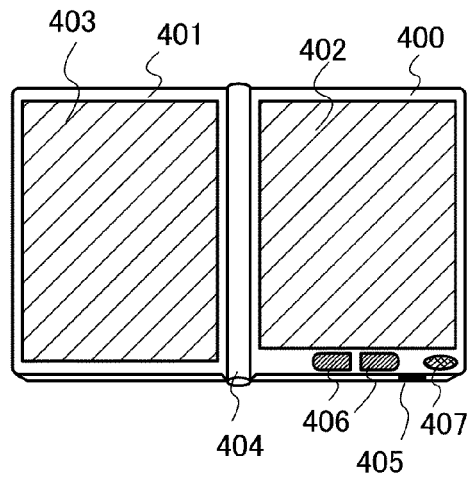
FIGS. 14A to 14D are views each illustrating an example of an electronic device.

FIG. 14A illustrates an example of an electronic book device. The electronic book device illustrated in FIG. 14A includes a housing 400 and a housing 401. The housing 400 and the housing 401 are combined with a hinge 404 so that the electronic book device can be opened and closed. With such a structure, the electronic book device can be handled like a paper book.

A display portion 402 and a display portion 403 are incorporated in the housing 400 and the housing 401, respectively.

The display portion 402 and the display portion 403 may be configured to display one image or different images. In the case where the display portion 402 and the display portion 403 display different images, for example, a display portion on the right side (the display portion 402 in FIG. 14A) can display text and a display portion on the left side (the display portion 403 in FIG. 14A) can display graphics. The display device described in Embodiment 2 can be applied to the display portion 402 and the display portion 403.

In FIG. 14A, the housing 400 is provided with a power input terminal 405, operation keys 406, a speaker 407, and the like. The operation keys 406 may have a function of turning pages, for example. Note that a keyboard, a pointing device, or the like may also be provided on the surface of the housing, on which the display portion is provided. Further, an external connection terminal (an earphone terminal, a USB terminal, a terminal that can be connected to various cables such as a USB cable, or the like), a recording medium insertion portion, or the like may be provided on the back surface or the side surface of the housing. Furthermore, the electronic book device illustrated in FIG. 14A may have a structure capable of wirelessly transmitting and receiving data.

Figure 14B:
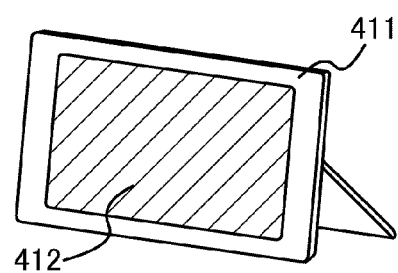

FIG. 14B illustrates an example of a digital photo frame. In the digital photo frame illustrated in FIG. 14B, a display portion 412 is incorporated in a housing 411. The display device described in Embodiment 2 can be applied to the display portion 412.

Note that the digital photo frame illustrated in FIG. 14B may be provided with an operation portion, an external connection terminal (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame. For example, a storage medium having image data taken with a digital camera is inserted into the storage medium inserting portion of the digital photo frame and the image data is imported, whereby the imported image data can be displayed on the display portion 412. Further, the digital photo frame illustrated in FIG. 14B may have a structure capable of wirelessly transmitting and receiving data.

Figure 14C:
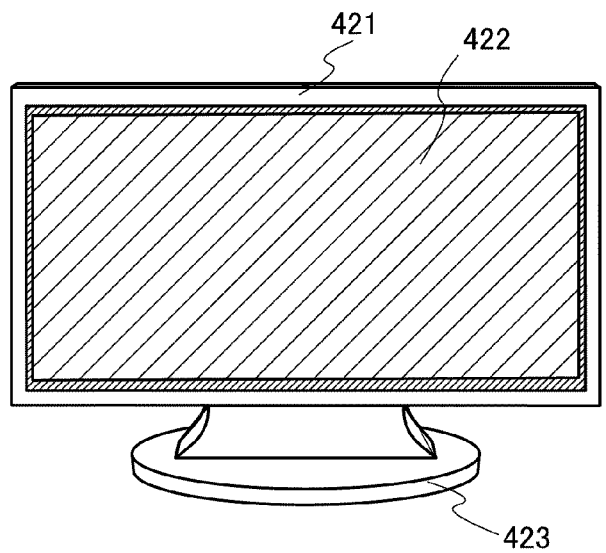

FIG. 14C illustrates an example of the television set. In the television set illustrated in FIG. 14C, a display portion 422 is incorporated in a housing 421. The housing 421 is supported by a stand 423 here. The display device described in Embodiment 2 can be applied to the display portion 422.

The television set illustrated in FIG. 14C can be operated with an operation switch of the housing 421 or a separate remote controller. Channels and volume can be adjusted with an operation key of the remote controller so that an image displayed in the display portion 422 can be adjusted. Further, the remote controller itself may be provided with a display portion for displaying data outputted from the remote controller.

Note that the television set illustrated in FIG. 14C is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

Figure 14D:
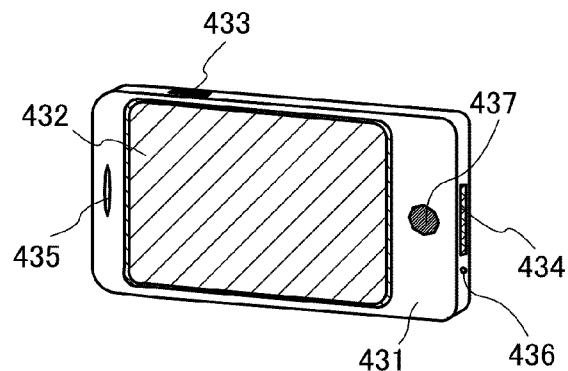

FIG. 14D illustrates an example of the mobile phone. The mobile phone illustrated in FIG. 14D is provided with a display portion 432 incorporated in a housing 431, an operation button 433, an operation button 437, an external connection port 434, a speaker 435, a microphone 436, and the like. The display device according to Embodiment 2 can be applied to the display portion 432.

The display portion 432 of the mobile phone illustrated in FIG. 14D may be a touch panel. In that case, when the display portion 432 is used as a touch panel, operations such as making calls and composing mails can be performed.

There are mainly three screen modes for the display portion 432. The first mode is a display mode mainly for displaying images. The second mode is an input mode mainly for inputting data such as text. The third mode is a display-and-input mode in which two modes of the display mode and the input mode are combined.

For example, in the case where a call is made or a mail is composed, a text input mode mainly for inputting text is selected for the display portion 432 so that characters displayed on a screen can be inputted. In that case, it is preferable to display a keyboard or number buttons on a large area of the screen of the display portion 432.

When a detection device including a sensor for detecting inclination, such as a gyroscope or an acceleration sensor, is provided inside the mobile phone illustrated in FIG. 14D, the mode (display data) of the display portion 432 can be automatically switched depending on the orientation of the mobile phone (whether the mobile phone is placed horizontally or vertically).

The screen modes are switched by touching the display portion 432 or using the operation button 437 of the housing 431. Alternatively, the screen modes may be switched depending on kinds of images displayed in the display portion 432.

Further, in the input mode, when operation by touching the display portion 432 is not performed for a certain period of time while a signal detected by an optical sensor in the display portion 432 is detected, the screen mode may be controlled so as to be switched from the input mode to the display mode.

The display portion 432 can also function as an image sensor. For example, an image of a palm print, a fingerprint, or the like is taken by an image sensor when the display portion 432 is touched with a palm or a finger, whereby personal authentication can be performed. Further, by providing a backlight or a sensing light source which emits near-infrared light in the display portion, an image of a finger vein, a palm vein, or the like can be taken.

As described above, the thin film transistor and the display device described in Embodiments 1 and 2 can be applied to a variety of electronic devices.

This application is based on Japanese Patent Application serial no. 2010-102205 filed with Japan Patent Office on Apr. 27, 2010, the entire contents of which are hereby incorporated by reference.

What is claimed is:

1. A manufacturing method of a microcrystalline semiconductor film, comprising:
   forming a first semiconductor film over a substrate by generating plasma by performing continuous discharge under an atmosphere containing a deposition gas;
   forming a second semiconductor film over the first semiconductor film by generating plasma by performing pulsed discharge under the atmosphere containing the deposition gas;
   forming a third semiconductor film over the second semiconductor film by generating plasma by performing continuous discharge under the atmosphere containing the deposition gas; and forming a fourth semiconductor film over the third semiconductor film by generating plasma by performing pulsed discharge under the atmosphere containing the deposition gas.

2. The manufacturing method according to claim 1,
wherein the step of forming the first semiconductor film is performed so that a plurality of crystal nuclei is generated and grows to crystals in the first semiconductor film, and
wherein the step of forming the second semiconductor film is performed so that spaces between the crystals grown from the plurality of crystal nuclei are filled.

3. The manufacturing method according to claim 1,
wherein the deposition gas includes silicon or germanium.

4. The manufacturing method according to claim 1, further comprising the step of providing a first electrode, a second electrode, and a gas supply unit in a chamber,
wherein the deposition gas is made to flow from the gas supply unit.

5. The manufacturing method according to claim 4,
wherein the plasma is generated between the first electrode and the second electrode.

6. A manufacturing method of a semiconductor device, comprising:
forming a gate electrode layer;
forming a gate insulating layer to cover the gate electrode layer;
forming a microcrystalline semiconductor film over the gate insulating layer by the manufacturing method of the microcrystalline semiconductor film according to claim 1; and
forming a source and a drain over the microcrystalline semiconductor film.

7. A manufacturing method of a microcrystalline semiconductor film, comprising:
forming a first semiconductor film over a substrate by generating plasma by performing continuous discharge under an atmosphere containing a first deposition gas;
forming a second semiconductor film over the first semiconductor film by generating plasma by performing pulsed discharge under an atmosphere containing a second deposition gas;
forming a third semiconductor film over the second semiconductor film by generating plasma by performing continuous discharge under the atmosphere containing the first deposition gas; and
forming a fourth semiconductor film over the third semiconductor film by generating plasma by performing pulsed discharge under the atmosphere containing the second deposition gas.

8. The manufacturing method according to claim 7,
wherein the step of forming the first semiconductor film is performed so that a plurality of crystal nuclei is generated and grows to crystals in the first semiconductor film, and
wherein the step of forming the second semiconductor film is performed so that spaces between the crystals grown from the plurality of crystal nuclei are filled.

9. The manufacturing method according to claim 7,
wherein each of the first deposition gas and the second deposition gas includes silicon or germanium.

10. The manufacturing method according to claim 7, further comprising the step of providing a first electrode and a second electrode,
wherein the plasma is generated between the first electrode and the second electrode.

11. A manufacturing method of a semiconductor device, comprising:
forming a gate electrode layer;
forming a gate insulating layer to cover the gate electrode layer;
forming a microcrystalline semiconductor film over the gate insulating layer by the manufacturing method of the microcrystalline semiconductor film according to claim 7; and
forming a source and a drain over the microcrystalline semiconductor film.

* * * * *